United States Patent
Barry et al.

(10) Patent No.: US 6,397,324 B1
(45) Date of Patent: May 28, 2002

(54) ACCESSING TABLES IN MEMORY BANKS USING LOAD AND STORE ADDRESS GENERATORS SHARING STORE READ PORT OF COMPUTE REGISTER FILE SEPARATED FROM ADDRESS REGISTER FILE

(75) Inventors: Edwin Frank Barry, Cary; Charles W. Kurak, Jr., Durham; Gerald G. Pechanek, Cary; Larry D. Larsen, Raleigh, all of NC (US)

(73) Assignee: BOPS, Inc., Chapel Hill, NC (US)

( * ) Notice: Subject to any disclaimer, the term of this patent is extended or adjusted under 35 U.S.C. 154(b) by 0 days.

(21) Appl. No.: 09/596,103

(22) Filed: Jun. 16, 2000

Related U.S. Application Data
(60) Provisional application No. 60/139,946, filed on Jun. 18, 1999.

(51) Int. Cl.$^7$ ................................................ G06F 9/312
(52) U.S. Cl. ........................ 712/225; 711/149; 711/220
(58) Field of Search ................................. 711/127, 149, 711/220; 712/225

(56) References Cited

U.S. PATENT DOCUMENTS

| | | | | |
|---|---|---|---|---|
| 4,583,165 A | * | 4/1986 | Rosenfeld | 711/213 |
| 5,333,118 A | * | 7/1994 | Rossmere et al. | 708/400 |
| 5,924,117 A | * | 7/1999 | Luick | 711/127 |
| 5,974,528 A | * | 10/1999 | Tsai et al. | 712/37 |
| 6,041,387 A | * | 3/2000 | Fleck et al. | 711/5 |

* cited by examiner

Primary Examiner—Kenneth S. Kim
(74) Attorney, Agent, or Firm—Priest & Goldstein, PLLC

(57) ABSTRACT

A very long instruction word (VLIW) processor typically requires a large number of register file ports due to the parallel execution of the sub-instructions comprising the VLIW. By splitting a general purpose register file into separate address and compute register files, the number of compute register file ports is significantly reduced. This reduction is particularly evident when multiple load and store execution units with indexed addressing modes are supported. The implication is that a faster register file and dedicated address registers are achieved in the programming model. The savings comes at the cost of providing support for data movement between the compute register file and the address register file. In addition, address arithmetic, table look-up, and store to table functions are desirable functions that cannot be obviously obtained when the address registers are separated from the compute registers. The present approach provides an efficient mechanism for supporting these functions while maintaining separate compute and address register files.

34 Claims, 20 Drawing Sheets

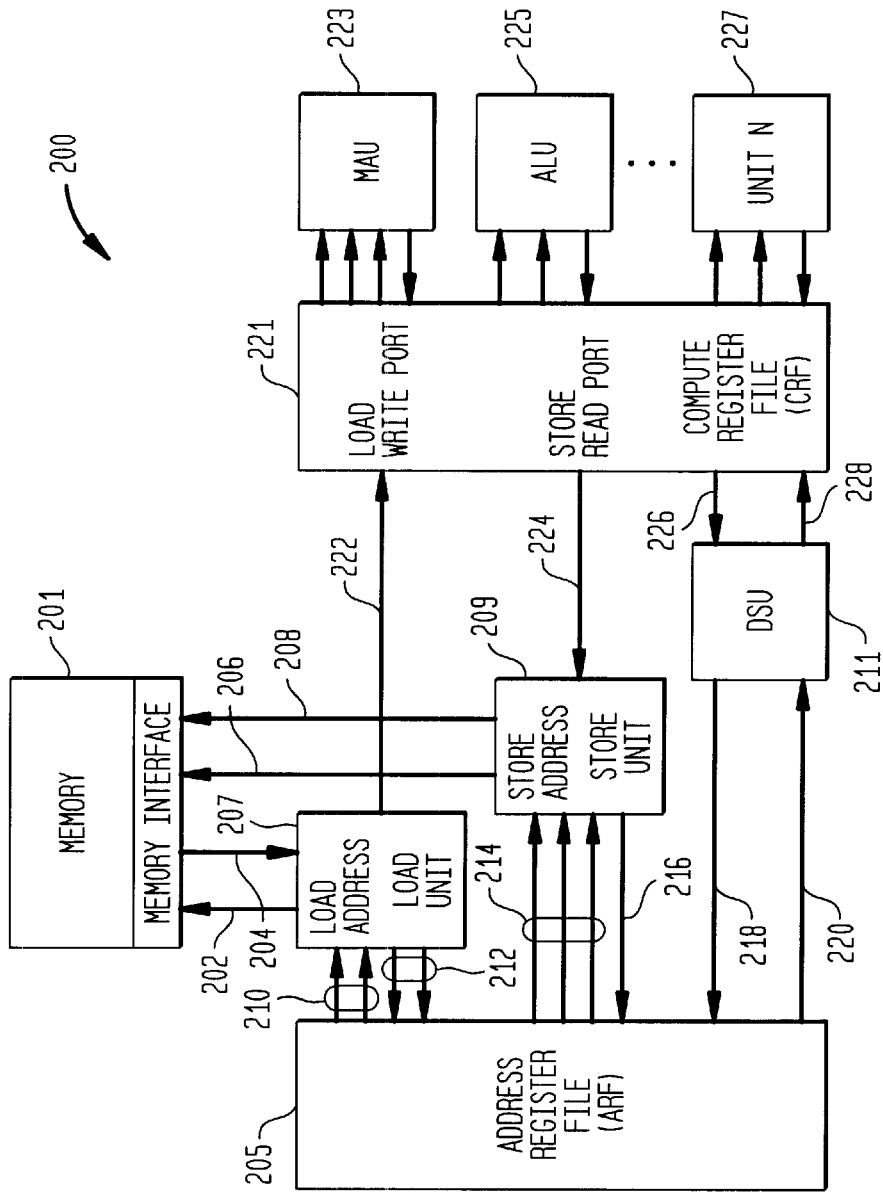

FIG. 5A
LTBL Encoding

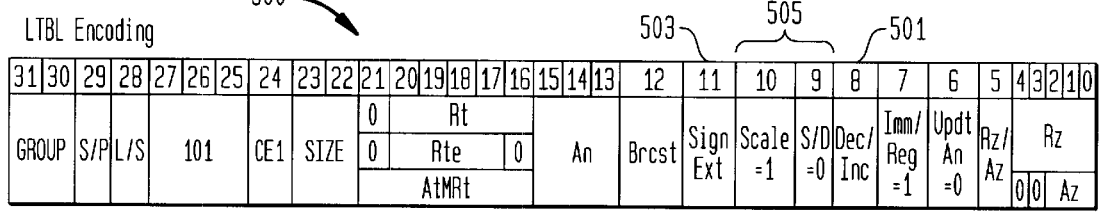

FIG. 5B
LTBL Syntax/Operation

| Instruction | Operands | Operation |
|---|---|---|
| Load Compute Register | | |
| LTBL.[SP].D | Rte, An, ±RzAz | Rto||Rte ← Mem[An ± (RzAz * 8)]$_{dword}$ |
| LTBL.[SP].W | Rt, An, ±RzAz | Rt ← Mem[An ± (RzAz *4)]$_{word}$ |
| LTBL.[SP].H0 | Rt, An, ±RzAz | Rt.H0 ← Mem[An ± (RzAz *2)]$_{hword}$ |
| LTBL.[SP].H0.X | Rt, An, ±RzAz | Rt.H0 ← Mem[An ± (RzAz *2)]$_{hword}$<br>Rt.H1 ← 0xFFFF if MSB(Mem[An ± (RzAz *2)]$_{hword}$)=1<br>Rt.H1 ← 0x0000 if MSB(Mem[An ± (RzAz *2)]$_{hword}$)=0 |
| LTBL.[SP].B0 | Rt, An, ±RzAz | Rt.B0 ← Mem[An ± (RzAz)]$_{byte}$ |
| LTBL.[SP].B0.X | Rt, An, ±RzAz | Rt.B0 ← Mem[An ± (RzAz)]$_{byte}$<br>Rt.B1 ← 0xFF if MSB(Mem[An ± RzAz]$_{byte}$)=1<br>Rt.B1 ← 0x00 if MSB(Mem[An ± RzAz]$_{byte}$)=0<br>Rt.H1 ← 0xFFFF if MSB(Mem[An ± RzAz]$_{byte}$)=1<br>Rt.H1 ← 0x0000 if MSB(Mem[An ± RzAz]$_{byte}$)=0 |
| T.LTBL.[SP].[DWH0B0].[X] | Rt, An, ±RzAz | Do operation only if T condition is satisfied in F0 |
| Load ARF/MRF Register | | |
| LTBL.[SP].W | AtMRt, An, ±RzAz | AtMRt ← Mem[An ± (RzAz * 4)]$_{word}$ |
| LTBL.[SP].[H0H1] | AtMRt, An, ±RzAz | AtMRt.Hx ← Mem[An ± (RzAz * 2)]$_{hword}$ (Note: Hx=H0 or H1) |
| LTBL.[SP].H0.X | AtMRt, An, ±RzAz | AtMRt.H0 ← Mem[An ± (RzAz * 2)]$_{hword}$<br>AtMRt.H1 ← 0xFFFF if MSB(Mem[An ± (RzAz * 2)]$_{hword}$)=1<br>AtMRt.H1 ← 0x0000 if MSB(Mem[An ± (RzAz * 2)]$_{hword}$)=0 |
| T.LTBL.[SP].[WH0H1].[X] | AtMRt, An, ±RzAz | Do operation only if T condition is satisfied in F0 |

FIG. 6A
L2TBL Encoding

| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|
| GROUP | | S/P | L/S | 101 | | | CE1 | SIZE | | 0 | | Rt | | | | | | | An | | Brcst | | Sign Ext | Scale =1 | S/D =1 | Dec/ Inc =1 | Imm/ Reg =1 | Updt An =0 | Rz/ Az | | Rz |
| | | | | | | | | | | 0 | | Rte | | | 0 | | | | | | | | | | | | | | 0 | 0 | Az |
| | | | | | | | | | | AtMRt | | | | | | | | | | | | | | | | | | | | | |

FIG. 6B
L2TBL Syntax/Operation

| Instruction | Operands | Operation |
|---|---|---|
| Dual Table Look Up Load Compute Register | | |
| L2TBL.[SP].2W | Rte, An, ±Rze | Rte ← MemBank0[An.H0 ± (Rze.H0 × 4)]$_{word}$<br>Rto ← MemBank1[An.H1 ± (Rzo.H0 × 4)]$_{word}$ |
| L2TBL.[SP].2H0 | Rte, An, ±Rze | Rte.H0 ← MemBank0[An.H0 ± (Rze.H0 × 2)]$_{hword}$<br>Rto.H0 ← MemBank1[An.H1 ± (Rzo.H0 × 2)]$_{hword}$ |
| L2TBL.[SP].2H0.X | Rte, An, ±Rze | Rte.H0 ← MemBank0[An.H0 ± (Rze.H0 × 2)]$_{hword}$<br>Rte.H1 ← 0xFFFF if MSB(MemBank0[An.H0 ± (Rze.H0 × 2)]$_{hword}$)=1<br>Rte.H1 ← 0x0000 if MSB(MemBank0[An.H0 ± (Rze.H0 × 2)]$_{hword}$)=0<br><br>Rto.H0 ← MemBank1[An.H1 ± (Rzo.H0 × 2)]$_{hword}$<br>Rto.H1 ← 0xFFFF if MSB(MemBank1[An.H1 ± (Rzo.H0 × 2)]$_{hword}$)=1<br>Rto.H1 ← 0x0000 if MSB(MemBank1[An.H1 ± (Rzo.H0 × 2)]$_{hword}$)=0 |
| L2TBL.[SP].2B0 | Rte, An, ±Rze | Rte.B0 ← MemBank0[An.H0 ± Rze.H0]$_{byte}$<br>Rte.B0 ← MemBank1[An.H1 ± Rzo.H0]$_{byte}$ |
| L2TBL.[SP].2B0.X | Rte, An, ±Rze | Rte.B0 ← MemBank0[An.H0 ± (Rze.H0]$_{byte}$<br>Rte.B1 ← 0xFF if MSB(MemBank0[An.H0 ± Rze.H0]$_{byte}$)=1<br>Rte.B1 ← 0x00 if MSB(MemBank0[An.H0 ± Rze.H0]$_{byte}$)=0<br>Rte.H1 ← 0xFFFF if MSB(MemBank0[An.H0 ± Rze.H0]$_{byte}$)=1<br>Rte.H1 ← 0x0000 if MSB(MemBank0[An.H0 ± Rze.H0]$_{byte}$)=0<br><br>Rto.B0 ← MemBank1[An.H1 ± Rzo.H0]$_{byte}$<br>Rto.B1 ← 0xFF if MSB(MemBank1[An.H1 ± Rzo.H0]$_{byte}$)=1<br>Rto.B1 ← 0x00 if MSB(MemBank1[An.H1 ± Rzo.H0]$_{byte}$)=0<br>Rto.H1 ← 0xFFFF if MSB(MemBank1[An.H1 ± Rzo.H0]$_{byte}$)=1<br>Rto.H1 ← 0x0000 if MSB(MemBank1[An.H1 ± Rzo.H0]$_{byte}$)=0 |
| T.L2TBL.[SP].[2W2H02B0].[X] | Rte, An, ±Rze | Do operation only if T condition is satisfied in F0 |

FIG. 7A

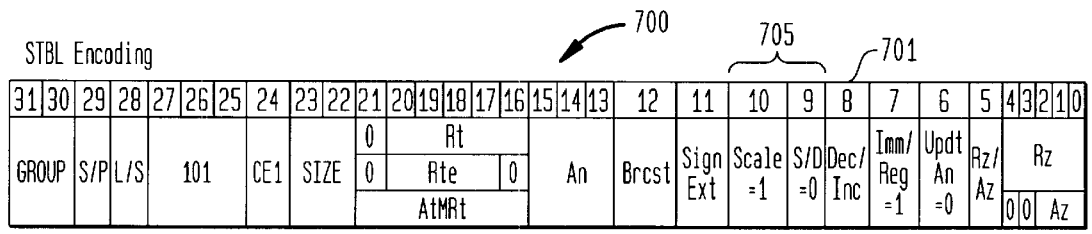

STBL Encoding

FIG. 7B

STBL Syntax/Operation — 710

| Instruction | Operands | Operation |
|---|---|---|
| | | Store Compute Register |
| STBL.[SP].D | Rte, An, ±RzAz | $Rto\|\|Rte \rightarrow Mem[An \pm (RzAz * 8)]_{dword}$ |
| STBL.[SP].W | Rt, An, ±RzAz | $Rt \rightarrow Mem[An \pm (RzAz * 4)]_{word}$ |
| STBL.[SP].H0 | Rt, An, ±RzAz | $Rt.H0 \rightarrow Mem[An \pm (RzAz * 2)]_{hword}$ |
| STBL.[SP].B0 | Rt, An, ±RzAz | $Rt.B0 \rightarrow Mem[An \pm RzAz]_{byte}$ |
| T.STBL.[SP].[DWH0B0] | Rt, An, ±RzAz | Do operation only if T condition is satisfied in F0 |
| | | Store ARF/MRF Register |
| STBL.[SP].W | AtMRt, An, ±RzAz | $AtMRt \rightarrow Mem[An \pm (RzAz * 4)]_{word}$ |
| STBL.[SP].[H0H1] | AtMRt, An, ±RzAz | $AtMRt.Hx \rightarrow Mem[An \pm (RzAz * 2)]_{hword}$ (Note: Hx=H0 or H1) |
| T.STBL.[SP].[WH0H1] | AtMRt, An, ±RzAz | Do operation only if T condition is satisfied in F0 |

FIG. 8A

S2TBL Encoding 800 → , 805, 801

| 31 30 | 29 | 28 | 27 26 25 | 24 | 23 22 | 21 | 20 19 18 17 16 | 15 14 13 | 12 | 11 | 10 | 9 | 8 | 7 | 6 | 5 4 | 3 2 | 1 0 |
|---|---|---|---|---|---|---|---|---|---|---|---|---|---|---|---|---|---|---|
| GROUP | S/P | L/S | 101 | CE1 | SIZE | 0 | Rt | | An | Brcst | Sign Ext | Scale =1 | S/D =1 | Dec/ Inc | Imm/ Reg =1 | Updt An =0 | Rz/ Az | Rz | |
| | | | | | | 0 | Rte | 0 | | | | | | | | | 0 0 | Az | |
| | | | | | | AtMRt | | | | | | | | | | | | | |

FIG. 8B

810 → S2TBL Syntax/Operation

| Instruction | Operands | Operation |
|---|---|---|
| | | Dual Table Look Up Load Compute Register |
| S2TBL.[SP].2W | Rte, An, ±Rze | Rte → MemBank0[An.H0 ± (Rze.H0 * 4)]$_{word}$<br>Rto → MemBank1[An.H1 ± (Rzo.H0 * 4)]$_{word}$ |
| S2TBL.[SP].2H0 | Rte, An, ±Rze | Rte.H0 → MemBank0[An.H0 ± (Rze.H0 * 2)]$_{hword}$<br>Rto.H0 → MemBank1[An.H1 ± (Rzo.H0 * 2)]$_{hword}$ |
| S2TBL.[SP].2B0 | Rte, An, ±Rze | Rte.B0 → MemBank0[An.H0 ± (Rze.H0)]$_{byte}$<br>Rto.B0 → MemBank1[An.H1 ± (Rzo.H0)]$_{byte}$ |
| T.S2TBL.[SP].[2W2H02B0].[X] | Rte, An, ±Rze | Do operation only if T condition is satisfied in F0 |

FIG. 9A

LATBL Encoding 900 → 905

| 31 30 29 28 | 27 26 25 | 24 23 22 21 20 | 19 18 17 16 | 15 14 13 | 12 | 11 | 10 9 | 8 | 7 | 6 | 5 | 4 3 2 1 0 |
|---|---|---|---|---|---|---|---|---|---|---|---|---|
| GROUP S/P L/S | 001 | CE1 SIZE 1 1 | At/Mt / At / Mt | An | Brcst =0 | Sign Ext =0 | Scale =1 | S/D | Dec/ Inc | Imm/ Reg =1 | Updt An =0 | Rz/ Az / Rz / 0 0 Az |

FIG. 9B

LATBL Syntax/Operation 910

| Instruction | Operands | Operation |
|---|---|---|
| LATBL.[SP].D | AtMt, An, ±RzAz | AtMt ← An ± (RzAz * 8) |
| LATBL.[SP].W | AtMt, An, ±RzAz | AtMt ← An ± (RzAz * 4) |
| LATBL.[SP].H0 | AtMt, An, ±RzAz | AtMt ← An.H0 ± (Rze.H0 * 2) |
| LATBL.[SP].2W | AtMt, An, ±RzAz | AtMt.H0 ← An.H0 ± (Rze.H0 * 4)<br>AtMt.H1 ← An.H1 ± (Rzo.H0 * 4) |
| LATBL.[SP].2H | AtMt, An, ±RzAz | AtMt.H0 ← An.H0 ± (Rze.H0 * 2)<br>AtMt.H1 ← An.H1 ± (Rzo.H0 * 2) |
| T.LATBL.[SP].x | AtMt, An, ±RzAz | Do operation only if T condition is satisfied in F0 |

FIG. 11
(PRIOR ART)

/* decode AC coefficients */
```
for (i=1;;i++)
{
  code = Show_Bits(16);
  if(code>=16384)
    tab = &DCTtabnext[(code>>12)-4];
  else if (code>=1024)
    tab = &DCTtab0[(code>>8)-4];
  else if (code>=512)
    tab = &DCTtab1[(code>>6)-8];
  else if (code>=256)
    tab = &DCTtab2[(code>>4)-16];
  else if (code>=128)
    tab = &DCTtab3[(code>>3)-16];
  else if (code>=64)
    tab = &DCTtab4[(code>>2)-16];
  else if (code>=32)
    tab = &DCTtab5[(code>>1)-16];
  else if (code>=16)
    tab = &DCTtab6[code-16];
  else
  {
        Fault_Flag = 1;
    return;
  {
```

FIG. 12A

SCANR Encoding 1200

| 31 30 | 29 28 27 | 26 25 24 23 22 21 | 20 19 18 17 16 | 15 14 13 12 11 | 10 9 8 7 6 | 5 4 3 | 2 1 0 |
|---|---|---|---|---|---|---|---|
| Group | S/P Unit | DSUopcode | Rt | Rx | 0 0 0 0 0 | ScanExt | CE3 |

FIG. 12B

SCANR Syntax/Operation 1210

| Instruction | Operands | Operation | ACF |
|---|---|---|---|
| SCANR.[SP]D.1W | Rt, Rx | Do operation below but do not affect ACF's | None |
| SCANR[Z].[SP]D.1W | Rt, Rx | Rt.B0 ← bit position of first '1' bit found in Rx (32-bit) while scanning from MSB to LSB | F0 |
| [TF].SCANR.[SP]D.1W | Rt, Rx | Do operation only if T/F condition is satisfied in ACFs | None |

FIG. 12C

BL Encoding

← 1220

| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|
| Group | | S/P | Unit | | DSUopcode | | | | | | $Rs_{4-0}$ | | | | | Rx | | | | | $Rs_5$ | Ft | | | BitOpExt | | | | 0 | CE2 | |

FIG. 12D

BL Syntax/Operation

← 1230

| Instruction | Operands | Operation | ACF |
|---|---|---|---|
| BL.[SP]D | Ft, Rs, Rx | Ft ← bit(Rx[4:0]) of Rs | Ft |
| [TF].BL.[SP]D | Ft, Rs, Rx | Do operation only if T/F condition is satisfied in F0 | Ft |

BLI Encoding

| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|
| Group | | S/P | Unit | | | DSUopcode | | | | | | $Rs_{4-0}$ | | | | | | BitNum | | | | $Rs_5$ | | | Ft | | | BitOpExt | | 0 | CE2 |

BLI Syntax/Operation

| Instruction | Operands | Operation | ACF |
|---|---|---|---|
| BLI.[SP]D | Ft, Rs, BitNum | Ft ← bit(BitNum) of Rs | Ft |
| [TF].BLI.[SP]D | Ft, Rs, BitNum | Do operation only if T/F condition is satisfied in F0 | Ft |

BSETI Encoding

BSETI Syntax/Operation

| Offset | Code segment address |
|---|---|
| 0 | Code_Fault |
| 1 | Code_Fault |
| 2 | Code_Fault |
| 3 | Code_Fault |
| 4 | Code_16 |
| 5 | Code_32 |
| 6 | Code_64 |
| 7 | Code_128 |
| 8 | Code_256 |
| 9 | Code_512 |
| 10 | Code_1024 |
| 11 | Code_16384 |
| 12 | Code_16384 |
| 13 | Code_16384 |
| 14 | Code_16384 |
| 15 | Code_16384 |

| Table Offset | run | level | length |
|---|---|---|---|
| 0 | 5 | 2 | 9 |
| 1 | 5 | 2 | 9 |
| 2 | 14 | 1 | 9 |
| 3 | 14 | 1 | 9 |
| 4 | 2 | 4 | 10 |
| 5 | 16 | 1 | 10 |
| 6 | 15 | 1 | 9 |
| 7 | 15 | 1 | 9 |

| | | | |
|---|---|---|---|
| 1501 | 1 | lv.S V0,40,2,D=,F= | // Set up iVLIW_40 by loading the two instructions into VIM at VIM address 40 with Vb=V0 |
| 1502 | 2 | T.addi.sa.1w RBITPTR,RBITPTR,32 | // conditionally increment pointer (flushbits) |
| 1503 | 3 | T.copy.sd.w RBFR_odd,RBFR | // conditionally copies word from buffer (flushbits) |
| 1504 | 4 | lv.s V0,41,2,D=,F= | // Set up iVLIW_41 by loading the two instructions into VIM at VIM address 41 with Vb=V0 |
| 1505 | 5 | ltbl.s.b0 R4,A5,+R3 | // table lookup of dezigzag scan index |
| 1506 | 6 | compiLE.sa.1w RBITPTR,31 | // Is pointer in the lower word? (flushbits) |
| 1507 | 7 | lv.s V0,42,2,D=,F= | // Set up iVLIW_42 by loading the two instructions into VIM at VIM address 42 with Vb=V0 |
| 1508 | 8 | T.lii.s.w RBFR,A0+,1 | // Conditionally loads new word from buffer |
| 1509 | 9 | cmpLT.sa.1w R3,R_64 | // in-range check (value(R3)<64) |
| 1510 | 10 | lv.s V0,28 | // Set up iVLIW_28 by loading the two instructions into VIM at VIM address 28 with Vb=V0 |
| 1511 | 11 | T.stbl.s.h0 R2,A3,+R4 | // Conditionally stores coefficient |
| 1512 | 12 | F.bseti.sd MPEG_STATUS,FAULT_FLAG | // Conditionally sets the fault flag if out-of-range |

| | | | |
|---|---|---|---|
| | | Decode_MPEG2_Intra_Block_Intra_VLC_Table_111011 | //1110_1s is run=0,level=5,len=6, and sign=T |
| 1521 | 1 | subi.sa.1w RBITPTR,RBITPTR,6 | // start of flushbits 6 |
| 1522 | 2 | xv.s V0,41,E=LA,F= | // Execute iVLIW #41 |
| 1523 | 3 | xv.s V0,40,E=AD,F= | // Execute iVLIW #40 |
| 1524 | 4 | xv.s V0,42,E=LA,F=A | // Execute iVLIW #42 |
| 1525 | 5 | lim.s.w R2,-5 | // Loads level= -5 into R2 |
| 1526 | 6 | xv.s V0,28,E=SD,F=N | // Execute iVLIW #28 |
| 1527 | 7 | T.jmp Decode_MPEG2_Intra_Block_Intra_VLC_for | // continue to the next code |
| 1528 | 8 | Jmp Decode_MPEG2_Intra_Block_Intra_VLC_return | // error: exit subroutine |

ACCESSING TABLES IN MEMORY BANKS USING LOAD AND STORE ADDRESS GENERATORS SHARING STORE READ PORT OF COMPUTE REGISTER FILE SEPARATED FROM ADDRESS REGISTER FILE

RELATED APPLICATIONS

The present invention claims the benefit of U.S. Provisional Application Ser. No. 60/139,946 entitled "Methods and Apparatus for Data Dependent Address Operations and Efficient Variable Length Code Decoding in a VLIW Processor" and filed Jun. 18, 1999 which is incorporated by reference herein in its entirety.

FIELD OF THE INVENTION

The present invention relates generally to improvements in array and indirect very long instruction word (iVLIW) processing, and more particularly to an advantageous data address generation architecture for a VLIW processor with separate compute and address register files that makes possible efficient variable length, run-length, and zigzag decoding in a programmable VLIW processor.

BACKGROUND OF THE INVENTION

A typical register-based processor architecture utilizes a general purpose register file (GPRF) to contain all the arithmetic operands used in performing computations, all computed results, and the various components, such as base, index, modulo values, and the like, used in resolving effective data or instruction addresses. More complex processors, VLIW processors in particular, may contain multiple arithmetic functional units as well as separate load and store units, thus increasing the number of ports required on the GPRF to provide simultaneous access to all the necessary operands. The GPRF grows increasingly difficult and expensive to implement as the number of ports rises, so it may be advantageous to split the GPRF into two or more separate register files and designate that the separate files serve specific purposes such as a compute register file and an address register file.

A complication arises with this approach, though, for high-performance data-dependent memory addressing operations. This problem is that the data dependent values, used for certain types of addressing, are produced in the compute register file separate from the address register and address generation functions. For example, look up table (LUT) operations use a data value as an offset into a table of values stored in memory to transform the data value into the looked-up value. This would seem to require another read port from the compute register file to provide an efficient table look-up operation. Since efficient handling of look up tables (LUTs) is of crucial importance for many applications, an efficient solution to the look up table problem is needed in processors where the compute and address registers are in separate files. A related problem is how to efficiently accomplish sequential variable length code (VLC) decoding and other front-end sequential video compression processing on an indirect VLIW (iVLIW) processor. The present invention when operating on an iVLIW processor advantageously provides a solution to these and other problems.

SUMMARY OF THE INVENTION

Table look-up and store operations are used in many digital signal processor (DSP) applications. They typically require an addressing mode such that a "base" register is used to point to the beginning of a table in memory and a data element stored in a separate register provides the offset into the table. The data type to be accessed (byte, half-word, word, double-word, etc.) determines the scaling of the offset as well as the size of the transfer. A data element may then be loaded or stored to or from the table in memory. These operations may be generally represented in the following way:

$R_t \leftarrow \text{Memory}[A_b + R_i]$; For table load $R_s \rightarrow \text{Memory}[A_b + R_i]$; For table load Where $R_t$ is a target compute register, $R_s$ is a source compute register, $A_b$ is a base (address) register, and $R_i$ is a compute register which contains a computed value which is used as an offset. The Memory[address] represents, for a load operation, the value stored in memory at the address within the brackets, and Memory[address], for a store operation, represents the location in memory at which the data $R_s$ is to be stored.

In the ManArray iVLIW architecture, the address and compute registers, $A_b$ and $R_i$ respectively, are in separate register files. Further, the array processor executes in pipeline fashion having at least a fetch, decode, and execute cycle to process instructions. An important question then is how to perform an efficient table-lookup or table store operation that uses registers from both files without increasing the number of read/write ports to the compute register file? With minimal programming conventions or restrictions, it is possible to share the compute register file's store unit's read port during the decode pipeline stage to allow a data-dependent address calculation to occur. The resultant address can then be used during execute to load from or store to a table in the processor's local memory. Utilizing a ManArray compute register file that uses two smaller register files, for example two 16×32-bit files, provides a cycle-by-cycle reconfigurable register file with the capability of doing dual independent table look-ups and table stores.

The ability to efficiently process compressed video data is an important capability that future digital signal processors need to provide. For example, the motion picture expert group MPEG-1 and MPEG-2 standards specify video compression processes that encode a video image into a compressed serial bitstream for efficient storage and transmission. Rather than utilize special purpose hardware logic, which adds to the complexity of a design and cannot be used for any other purposes, general instruction capability is available in the ManArray processor to efficiently process the sequential codes. A number of architectural features are used including bit-operations, table look-up, table store, conditional execution, and iVLIWs. When these sequential routines are translated into assembler code in a typical general purpose processor or DSP, the routine for decoding the non-zero frequency values or AC coefficients becomes branch intensive, representing a time consuming expense for the application. Because of this time consuming sequential processing, typical prior art systems have used hardware assist approaches to implement the VLC decode function. In one aspect of the present invention, the instruction set capabilities of the ManArray processor are used, including iVLIWs, to provide efficient processing of sequential MPEG variable length codes, as discussed in greater detail below.

These and other features, aspects and advantages of the invention will be apparent to those skilled in the art from the following detailed description taken together with the accompanying drawings.

BRIEF DESCRIPTION OF THE DRAWINGS

FIG. 2A illustrates a separate address register file, compute register file, and surrounding execution unit apparatus without the shared store port utilization technique of the present invention;

FIG. 5A illustrates an exemplary load from table (LTBL) instruction encoding in accordance with the present invention;

FIG. 5B illustrates the LTBL instruction syntax and operation description for the instruction of FIG. 5A;

FIG. 6A illustrates an exemplary load from two tables (L2TBL) instruction encoding in accordance with the present invention;

FIG. 6B illustrates the L2TBL instruction syntax and operation description for the instruction of FIG. 6A;

FIG. 7A illustrates an exemplary store to table (STBL) instruction encoding in accordance with the present invention;

FIG. 7B illustrates the STBL instruction syntax and operation description for the instruction of FIG. 7A;

FIG. 8A illustrates an exemplary store to two tables (S2TBL) instruction encoding in accordance with the present invention;

FIG. 8B illustrates the S2TBL instruction syntax and operation description for the instruction of FIG. 8A;

FIG. 9A illustrates an exemplary load address of table item (LATBL) instruction encoding in accordance with the present invention;

FIG. 9B illustrates the LATBL instruction syntax and operation description for the instruction of FIG. 9A;

FIG. 11 illustrates a prior art sample of C code for decoding of AC coefficients;

FIG. 12A illustrates a scan right (SCANR) instruction encoding in accordance with the present invention;

FIG. 12B illustrates the SCANR syntax and operation description for the instruction of FIG. 12A;

FIG. 12C illustrates a bit load (BL) instruction encoding in accordance with the present invention;

FIG. 12D illustrates the BL syntax and operation description for the instruction of FIG. 12C;

FIG. 13A illustrates a sample address table suitable for use with table look-up operations in the variable length code (VLC) decoding operations described in the present invention;

FIG. 13B illustrates a sample run length table suitable for use with table look-up operations in the run length decoding operation described in the present invention;

FIG. 15A illustrates a sample of iVLIW set up code for one of the variable length codes, 111011.

FIG. 15B illustrates executable code for one of the variable length codes, 111011, using load table and store to table instructions in VLIW parallel instructions for the purpose of decoding a highly sequential bit stream as described in the present invention.

DETAILED DESCRIPTION

Figure 1:
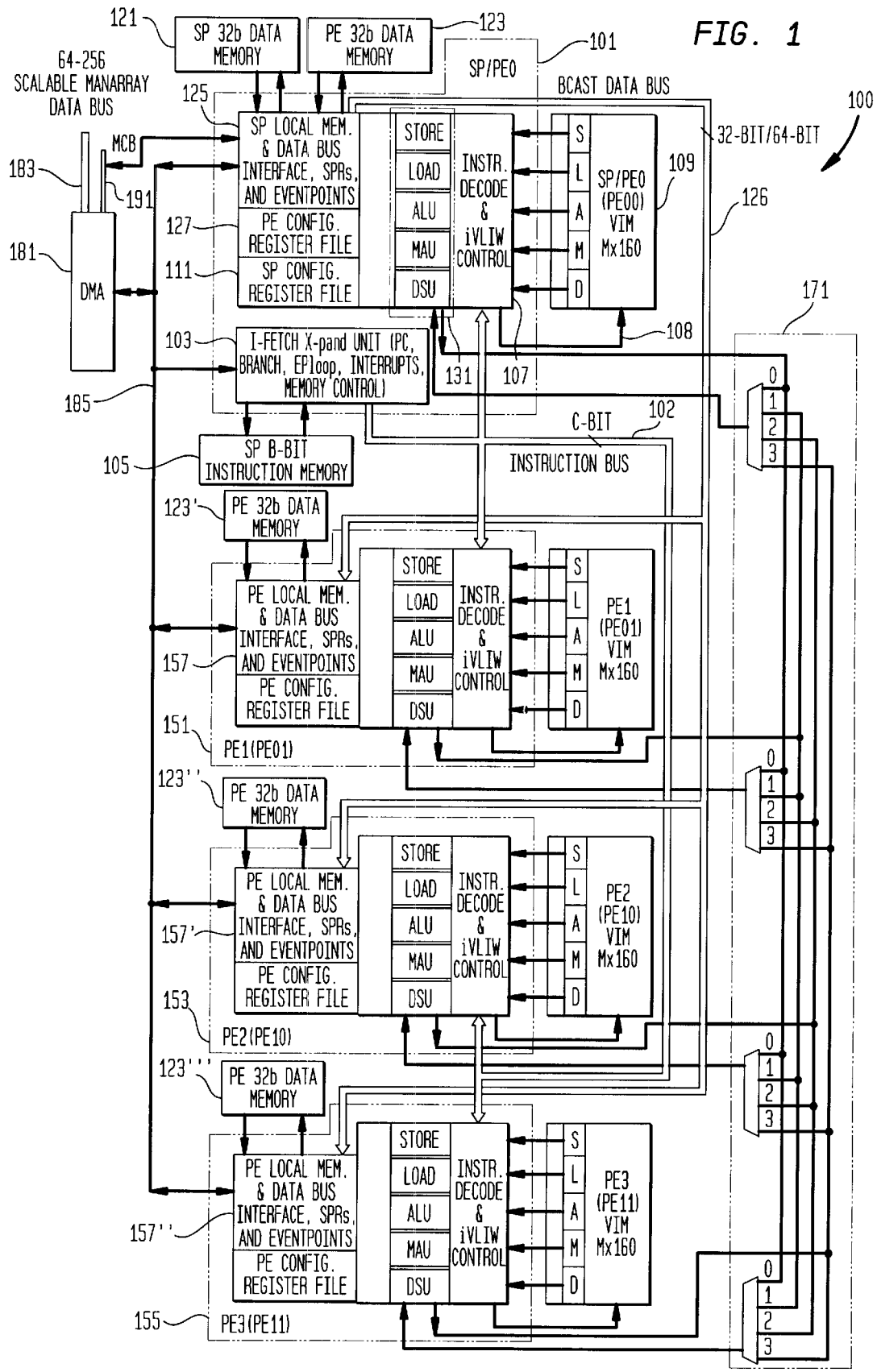
FIG. 1 illustrates a ManArray 2×2 iVLIW processor showing the connections to a plurality of processing elements connected in an array topology for use in conjunction with the present invention.

Further details of a presently preferred ManArray core, architecture, and instructions for use in conjunction with the present invention are found in U.S. patent application Ser. No. 08/885,310 filed Jun. 30, 1997, now U.S. Pat. No. 6,023,753, U.S. patent application Ser. No. 08/949,122 filed Oct. 10, 1997, U.S. patent application Ser. No. 09/169,255 filed Oct. 9, 1998, U.S. patent application Ser. No. 09/169,256 filed Oct. 9, 1998, U.S. patent application Ser. No. 09/169,072 filed Oct. 9, 1998, U.S. patent application Ser. No. 09/187,539 filed Nov. 6, 1998, U.S. patent application Ser. No. 09/205,558 filed Dec. 4, 1998, U.S. patent application Ser. No. 09/215,081 filed Dec. 18, 1998, U.S. patent application Ser. No. 09/228,374 filed Jan. 12, 1999 and entitled "Methods and Apparatus to Dynamically Reconfigure the Instruction Pipeline of an Indirect Very Long Instruction Word Scalable Processor", U.S. patent application Ser. No. 09/238,446 filed Jan. 28, 1999, U.S. patent application Ser. No. 09/267,570 filed Mar. 12, 1999, U.S. patent application Ser. No. 09/337,839 filed Jun. 22, 1999, U.S. patent application Ser. No. 09/350,191 filed Jul. 9, 1999, U.S. patent application Ser. No. 09/422,015 filed Oct. 21, 1999 entitled "Methods and Apparatus for Abbreviated Instruction and Configurable Processor Architecture", U.S. patent application Ser. No. 09/432,705 filed Nov. 2, 1999 entitled "Methods and Apparatus for Improved Motion Estimation for Video Encoding", U.S. patent application Ser. No. 09/471,217 filed Dec. 23, 1999 entitled "Methods and Apparatus for Providing Data Transfer Control", U.S. patent application Ser. No. 09/472,372 filed Dec. 23, 1999 entitled "Methods and Apparatus for Providing Direct Memory Access Control", as well as, Provisional Application Serial No. 60/113,637 entitled "Methods and Apparatus for Providing Direct Memory Access (DMA) Engine" filed Dec. 23, 1998, Provisional Application Serial No. 60/113,555 entitled "Methods and Apparatus Providing Transfer Control" filed Dec. 23, 1998, Provisional Application Serial No. 60/139,946 entitled "Methods and Apparatus for Data Dependent Address Operations and Efficient Variable Length Code Decoding in a VLIW Processor" filed Jun. 18, 1999, Provisional Application Serial No. 60/140,245 entitled "Methods and Apparatus for Generalized Event Detection and Action Specification in a Processor" filed Jun. 21, 1999, Provisional Application Serial No. 60/140,163 entitled "Methods and Apparatus for Improved Efficiency in Pipeline Simulation and Emulation" filed Jun. 21, 1999, Provisional Application Serial No. 60/140,162 entitled "Methods and Apparatus for Initiating and Re-Synchronizing Multi-Cycle SIMD Instructions" filed Jun. 21, 1999, Provisional Application Serial No. 60/140,244 entitled "Methods and Apparatus for Providing One-By-One Manifold Array (1×1 ManArray) Program Context Control" filed Jun. 21, 1999, Provisional Application Serial No. 60/140,325 entitled "Methods and Apparatus for Establishing Port Priority Function in a VLIW Processor" filed Jun. 21, 1999, Provisional Application Serial No. 60/140,425 entitled "Methods and Apparatus for Parallel Processing Utilizing a Manifold Array (ManArray) Architecture and Instruction Syntax" filed Jun. 22, 1999, Provisional Application Serial No. 60/165,337 entitled "Efficient Cosine Transform Implementations on the ManArray Architecture" filed Nov. 12, 1999, and Provisional Application Serial No. 60/171,911 entitled "Methods and Apparatus for DMA Loading of Very Long Instruction Word Memory" filed Dec. 23, 1999, Provisional Application Serial No. 60/184,668 entitled "Methods and Apparatus for Providing Bit-Reversal and Multicast Functions Utilizing DMA Controller" filed Feb. 24, 2000, Provisional Application Serial No. 60/184,529 entitled "Methods and Apparatus for Scalable Array Processor Interrupt Detection and Response" filed Feb. 24, 2000, Provisional Application Serial No. 60/184,560 entitled "Methods and Apparatus for Flexible Strength Coprocessing Interface" filed Feb. 24, 2000, and Provisional Application Serial No. 60/203,629 entitled "Methods and Apparatus for Power Control in a Scalable Array of Processor Elements" filed May 12, 2000, respectively, all of which are assigned to the assignee of the present invention and incorporated by reference herein in their entirety.

In a presently preferred embodiment of the present invention, a ManArray 2×2 iVLIW single instruction multiple data stream (SIMD) processor 100 shown in FIG. 1 contains a controller sequence processor (SP) combined with a processing element-0 (PE0) SP/PE0 101, as described in further detail in U.S. application Ser. No. 09/169,072 entitled "Methods and Apparatus for Dynamically Merging an Array Controller with an Array Processing Element". This embodiment is exemplary only and is utilized to demonstrate data dependent address operations in a VLIW processor with separate compute and address register files in accordance with the present invention. Three additional PEs 151, 153, and 155 are also shown to illustrate the use of the present invention in the effective implementation various algorithms such as the 8×8 2D inverse discrete cosine transform (IDCT) as described in further detail in U.S. Provisional Application Serial No. 60/165,337 entitled "Methods and Apparatus for Efficient Cosine Transform Implementations" and filed Nov. 12, 1999 which is incorporated by reference herein in its entirety. It is noted that the PEs can be also labeled with their matrix positions as shown in parentheses for PE0 (PE00) 101, PE1 (PE01)151, PE2 (PE10) 153, and PE3 (PE11) 155. The SP/PE0 101 contains a fetch controller 103 to allow the fetching of short instruction words (SIWs), also known as native instructions, from a B=32-bit instruction memory 105. The fetch controller 103 provides the typical functions needed in a programmable processor such as a program counter (PC), branch capability, digital signal processing eventpoint loop operations, support for interrupts, and also provides the instruction memory management control which could include an instruction cache if needed by an application. In addition, the SIW I-Fetch controller 103 dispatches 32-bit SIWs to the other PEs in the system by means of a 32-bit instruction bus 102.

In this exemplary system, common elements are used throughout to simplify the explanation, though actual implementations are not so limited. For example, the execution units 131 in the combined SP/PE0 101 can be separated into a set of execution units optimized for the control function, for example, fixed point execution units, and the PE0 as well as the other PEs 151, 153 and 155 can be optimized for a floating point application. For the purposes of this description, it is assumed that the execution units 131 are of the same type in the SP/PE0 and the other PEs. In a similar manner, SP/PE0 and the other PEs use a five instruction slot iVLIW architecture which contains a very long instruction word memory (VIM) memory 109 and an instruction decode and VIM controller function unit 107 which receives instructions as dispatched from the SP/PE0's I-Fetch unit 103 and generates the VIM addresses-and-control signals 108 required to access the iVLIWs stored in the VIM. Store, load, arithmetic logic unit (ALU), multiply accumulate unit (MAU), and data select unit (DSU) instruction types are identified by the letters SLAMD in VIM 109 as follows; store (S), load (L), ALU (A), MAU (M), and DSU (D). The loading of the iVLIWs is described in further detail in U.S. patent application Ser. No. 09/187,539 entitled "Methods and Apparatus for Efficient Synchronous MIMD Operations with iVLIW PE-to-PE Communication". Also contained in the SP/PE0 and the other PEs is a common PE configurable register file 127 which is described in further detail in U.S. patent application Ser. No. 09/169,255 entitled "Methods and Apparatus for Dynamic Instruction Controlled Reconfiguration Register File with Extended Precision".

Due to the combined nature of the SP/PE0, the data memory interface controller 125 must handle the data processing needs of both the SP controller, with SP data in memory 121, and PE0, with PE0 data in memory 123. The SP/PE0 controller 125 also is the source of the data that is sent over the 32-bit or 64-bit broadcast data bus 126 depending upon the implementation. The other PEs 151, 153, and 155 contain their own physical data memory units 123', 123", and 123''' though the data stored in them is generally different as required by the local processing done on each PE. The interface to these PE data memories is also a common design in PEs 1, 2, and 3 and indicated by PE local memory and data bus interface logic 157, 157' and 157".

Interconnecting the PEs for data transfer communications is the cluster switch 171 more completely described in U.S. Pat. No. 6,023,753 entitled "Manifold Array Processor", U.S. application Ser. No. 09/949,122 entitled "Methods and Apparatus for Manifold Array Processing", and U.S. application Ser. No. 09/169,256 entitled "Methods and Apparatus for ManArray PE-to-PE Switch Control". The interface to a host processor, other peripheral devices, and/or external memory can be done in many ways. The primary mechanism shown for completeness is contained in a direct memory access (DMA) control unit 181 that provides a scalable ManArray data bus 183 that connects to devices and interface units external to the ManArray core. The DMA control unit 181 provides the data flow and bus arbitration mechanisms needed for these external devices to interface to the ManArray core memories via the multiplexed bus interface represented by line 185. A high level view of a ManArray Control Bus (MCB) 191 is also shown.

All of the above noted patents and applications are assigned to the assignee of the present invention and incorporated herein by reference in their entirety.

Data Dependent Address Operations

Turning now to specific details of the ManArray processor apparatus as adapted to the present invention, it is shown that efficient data-dependent memory access operations can be provided in the ManArray processor with separate compute and address register files without increasing the number of ports required in the compute register file. Consider the ManArray iVLIW processor 100 of FIG. 1 that consists of an instruction sequence processor (SP) capable of dispatching an instruction to an array of processing elements (PEs). Within the SP and each PE are multiple execution units associated with the sub-instructions of the VLIW. Among the execution units are at least one load unit and one store unit designed to access one or more data memories attached to the SP or PEs. The array processor executes in pipeline fashion having at least one of each of the following stages: a fetch stage, a decode stage and an execute stage. It is noted that other pipeline operations are equally valid: for example, see co-pending U.S. patent application Ser. No. 09/228,374 entitled "Methods and Apparatus to Dynamically Expand the Instruction Pipeline of a Very Long Instruction Word Processor" filed Jan. 12, 1999. It is further noted that the concepts described herein are equally applicable to VLIW uni-processor designs. For example, the designs for the ManArray iVLIW SP, as a uni-processor, and the ManArray iVLIW 1-SP×1-PE, 1×1, all may suitably use the inventive concepts described in the present application.

An address register file (ARF) contains registers used for address generation by the load and store units where the load and store units each have read and write ports into the ARF. Each execution unit has one or more ports into a compute register file (CRF) and data is moved between memory and the CRF with load and store operations. To accomplish the data movement between the data memory and the CRF, the load unit requires a single write port into the CRF and the store unit requires a single read port out of the CRF. One exemplary arrangement of a CRF and an ARF without the shared port utilization techniques of the present invention is illustrated in FIG. 2A, which shows a separate address register file (ARF) 205, a separate compute register file (CRF) 221, up to N execution units (207, 209, 211, 223, 225, ..., 227), and numerous register file connections to be described in further detail below. Arrows coming out of a register file represent read ports and arrows going into a register file represent write ports. A read or write port though illustrated as a single line will typically consist of multiple lines, such as address, control, and data signal lines. In addition, the reconfigurable nature of the compute register file is not shown though each sub portion, 16×32-bits in the exemplary implementation described herein, supports only 32-bit reads and 32-bit writes. For operations which require 64-bits, both sub portions of the register file are used.

Figure 2B:
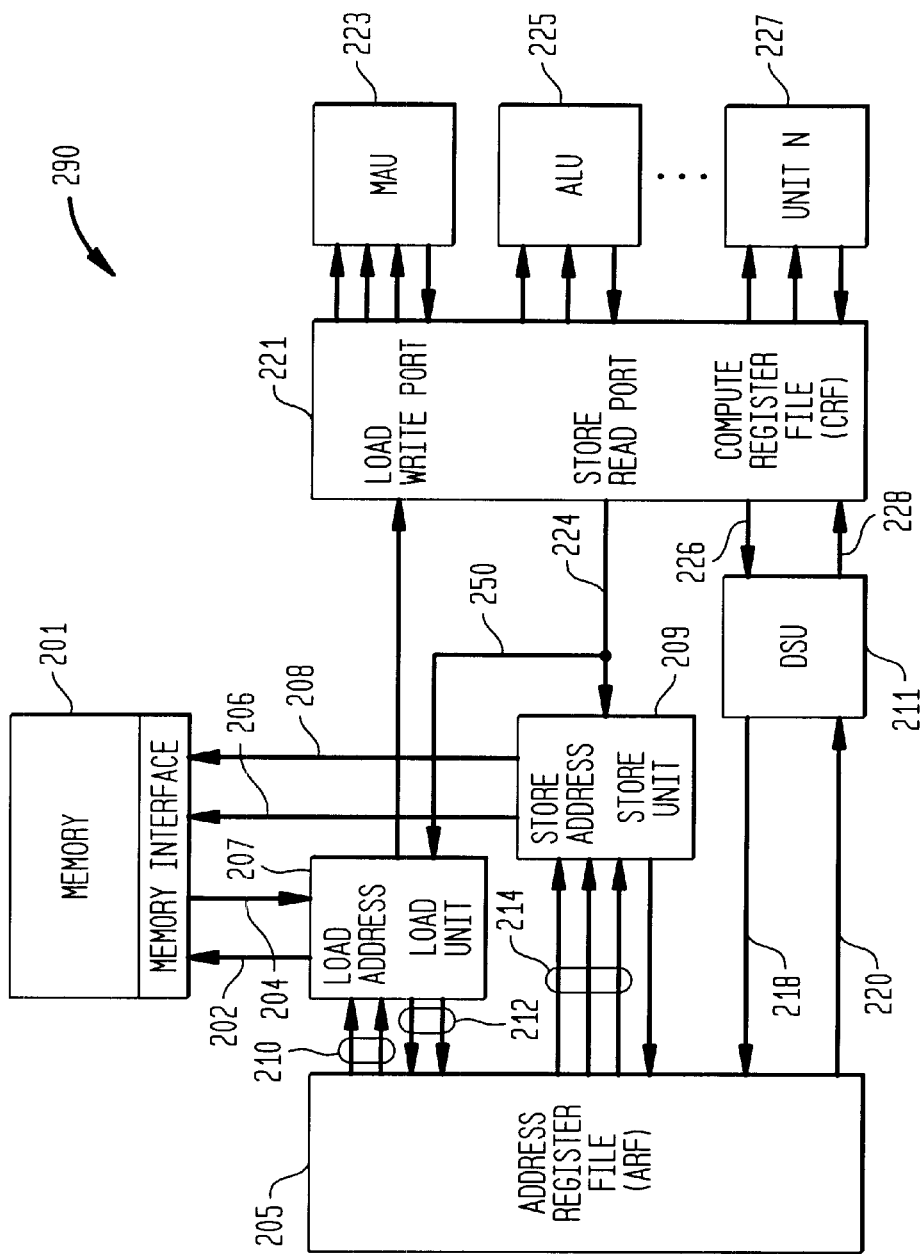
FIG. 2B illustrates separate address register file, compute register file, and surrounding execution unit apparatus employing the shared store port utilization technique in accordance with the present invention.

One aspect of the present invention is a mechanism that provides the load unit with access to the store CRF read port, making it possible to generate data-dependent data load operations. This shared utilization technique is depicted in FIG. 2B. Another aspect of this invention is a mechanism that supports a multiple bank memory that makes it possible to generate multiple independent data-dependent load and store operations. In the present ManArray architecture, the local data memories for the SP and each PE are currently organized as two memory banks to support independent, simultaneous accesses by the processing unit, and the direct memory access (DMA) controller, though the use of four or more local memory banks is not precluded.

The specific operation of the ManArray data-dependent memory access apparatus of the present invention is now described in further detail. Beginning with FIG. 2A, the core elements of a single ManArray PE 200 are shown to contain CRF and ARF register files 221 and 205, respectively, along with a set of execution units 207, 209, 211, 223, 225, ..., 227, and local memory 201. One of the execution units is a data select unit (DSU) 211. The DSU provides an instruction controlled data path between the two register files via paths 218, 220, 226, and 228. The load unit 207 has a write port 222, consisting of data, port address, and port control lines, into the CRF 221 and generates memory load address and control lines 202 to retrieve data in the memory 201 via path 204. The store unit 209 has a single CRF read port 224 consisting of data, port address, and port control lines and generates memory store address and control lines 206 to store a data value into memory via path 208. For non-data dependent load or store unit operations that move data between the memory 201 and the CRF 221, the memory address 202 or 206 is generated in the decode pipeline stage from address registers retrieved from the ARF 205. Then, during the execute stage of the pipeline, the CRF 221 ports 222 or 224, are used to accomplish the loading or retrieving of data to or from the CRF 221. In a typical iVLIW operation, both of these ports 222 and 224 can be used simultaneously during the execute stage for processing a load and a store instruction in parallel. For those applications that do not need continuous back-to-back parallel load and store operations, the load and store ports 222 and 224 can be freed up for other uses, such as for data-dependent load and store operations. If these data-dependent loads and stores are not of a high utilization nature, then, with proper programming conventions or restrictions, an application's performance can be improved by the shared use of these ports as taught herein.

To accomplish a data-dependent load operation, the store port 224 is used to efficiently access the data index value used in the memory address generation operation. One system 290 for accomplishing this desired operation is shown in FIG. 2B where the store port 224 is now shown to be connected to the load unit 207 via a new signal path 250 in addition to the connection to store unit 209. It is noted that the normal VLIW use of the load and store ports during the pipeline execute stage is not precluded by this sharing of the store port. The load unit for data-dependent load operations and the store unit for data-dependent store operations share the store port during the decode pipeline stage. This arrangement allows, for example, a simple mechanism to do a data-dependent atomic swap operation between memory and a register by using the load and store slots in a VLIW.

Figure 3:
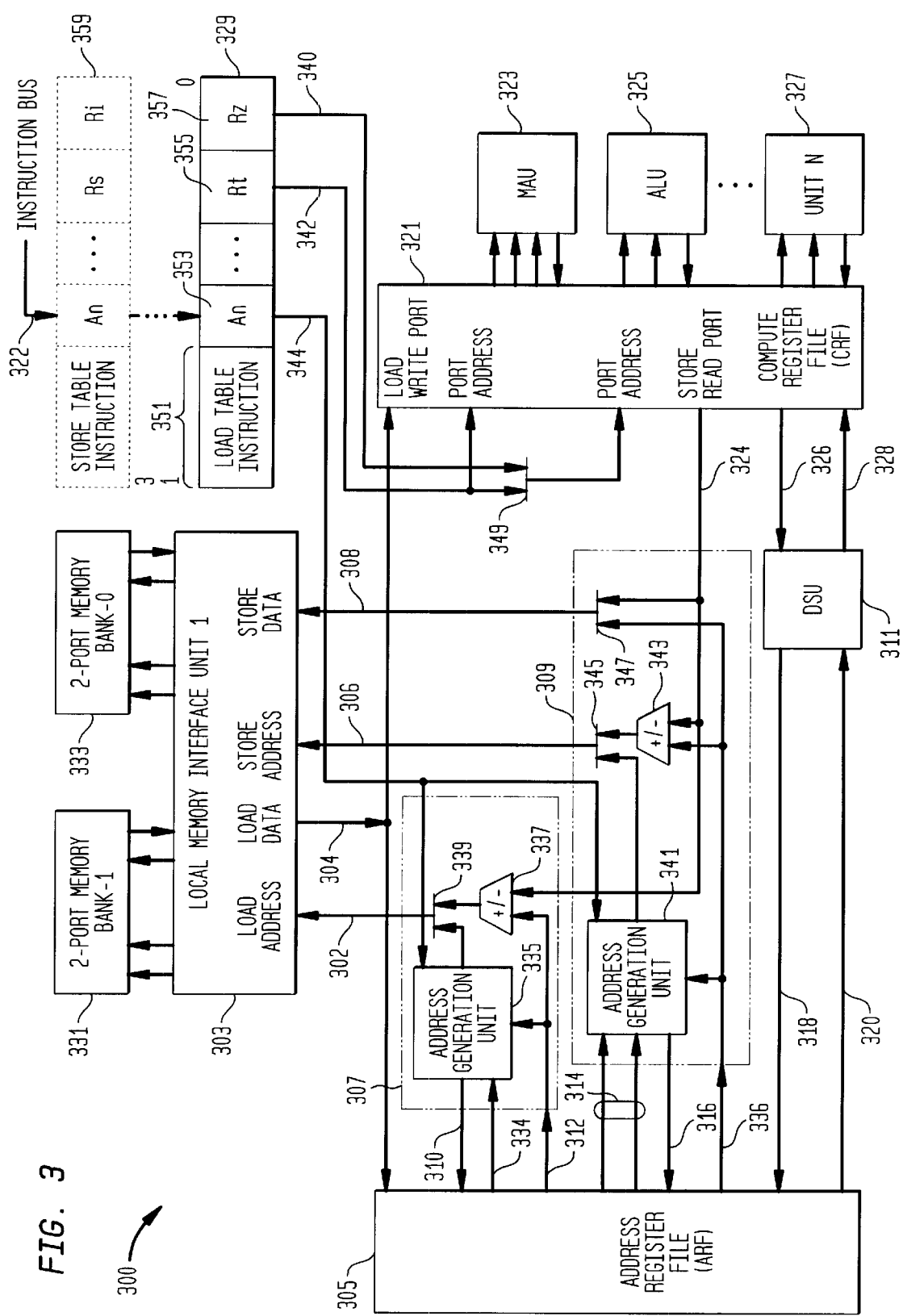
FIG. 3 illustrates a single load table and store to table apparatus in accordance with the present invention.

FIG. 3 shows a more detailed logical view of a single load table and single store to table apparatus 300 for performing a data-dependent table look-up operation in accordance with the present invention. Exemplary detailed instruction format and operation descriptions are contained in FIGS. 5A and 5B for a presently preferred table look-up load table instruction (LTBL), and in FIGS. 7A and 7B for a presently preferred store to table instruction (STBL). For the discussion which follows, it is assumed that an address base register has been set up in an ARF 305 by separate load instructions using a data path 304 from a local memory interface unit 303 to the ARF 305 prior to dispatching a load table instruction for execution. For the purposes of this description, the two banks of memory shown in FIG. 3, memory bank-1 331 and memory bank-0 333, are each individually accessible by a load or a store table instruction.

A dispatched instruction is received from an instruction bus 322 into an instruction register 329. This instruction specifies a load table operation is to be performed. The load table instruction contains opcode 351, ARF register field (An) 353, target register field (Rt/Rte) 355, and data-dependent offset register address field (Rz) 357 portions as part of the instruction format. The store read port 324 of the CRF 321 is used during the decode stage of processing to read the index register Rz from the CRF 321 as selected by the Rz field in the instruction via interface 340. The Rz data read from the CRF 321 via the store read port 324, is added by adder 337 during decode to a base address in register An, read from the ARF 305, as specified by the An field 353 in the instruction on interface 344. An effective address for the local data memory 331 or 333 is then resolved by selecting multiplexer 339 to select the (An+Rz) value as the memory load address 302. This data dependent effective address is latched and then passed, during the execute phase, to the address interface 302 of the local memory interface units 303, where it is used to access the appropriate memory location and retrieve a data value. This data value arrives via the load data interface 304 at the CRF load write port and is directed to the register address, Rt/Rte, specified in the instruction via path 342 to be loaded into the CRF at the end of the execute stage. For a store table instruction, similar instruction fields are provided as shown in block 359: a store table base address at ARF register address An, a CRF register address Ri, and a source register address Rs in place of the target register address used in the load table instruction.

The effective address for a store to table instruction is formed in exactly the same way as for a load from table instruction. That is, the read port 324 of the CRF is used during the decode stage of processing to read the index register $R_i$ from the CRF as specified by the signal on line 340 selected through multiplexer 349. This index register $R_i$, read from the CRF 321 on store read port 324, is added by adder 343 during decode to a base address register $A_n$, fetched from the ARF 305 on interface 336. An effective address for the local data memory 331 or 333 is then resolved by causing multiplexer 345 to select the $(A_n+R_i)$ value as the memory store address 306. This data-dependent effective address is latched and then passed during the execute phase, to the address interface 306 of the local memory interface units 303, where it is used to access the memory location to store a data value via the store data interface 308. During the execute phase, the data value is read from the CRF (at location Rs as specified by the signal on line 342 selected through multiplexer 349) on the store data interface 324 and selected by multiplexer 347, thus placing the data value onto the store data interface 308. The CRF value from location Rs is then stored into the memory at the end of the execute stage. It is noted that the normal parallel VLIW use of the load unit 307, with address generation unit 335, and store unit 309, with address generation unit 341, along with their respective CRF and ARF write and read ports, is not precluded by the described sharing of the store port.

Figure 4:
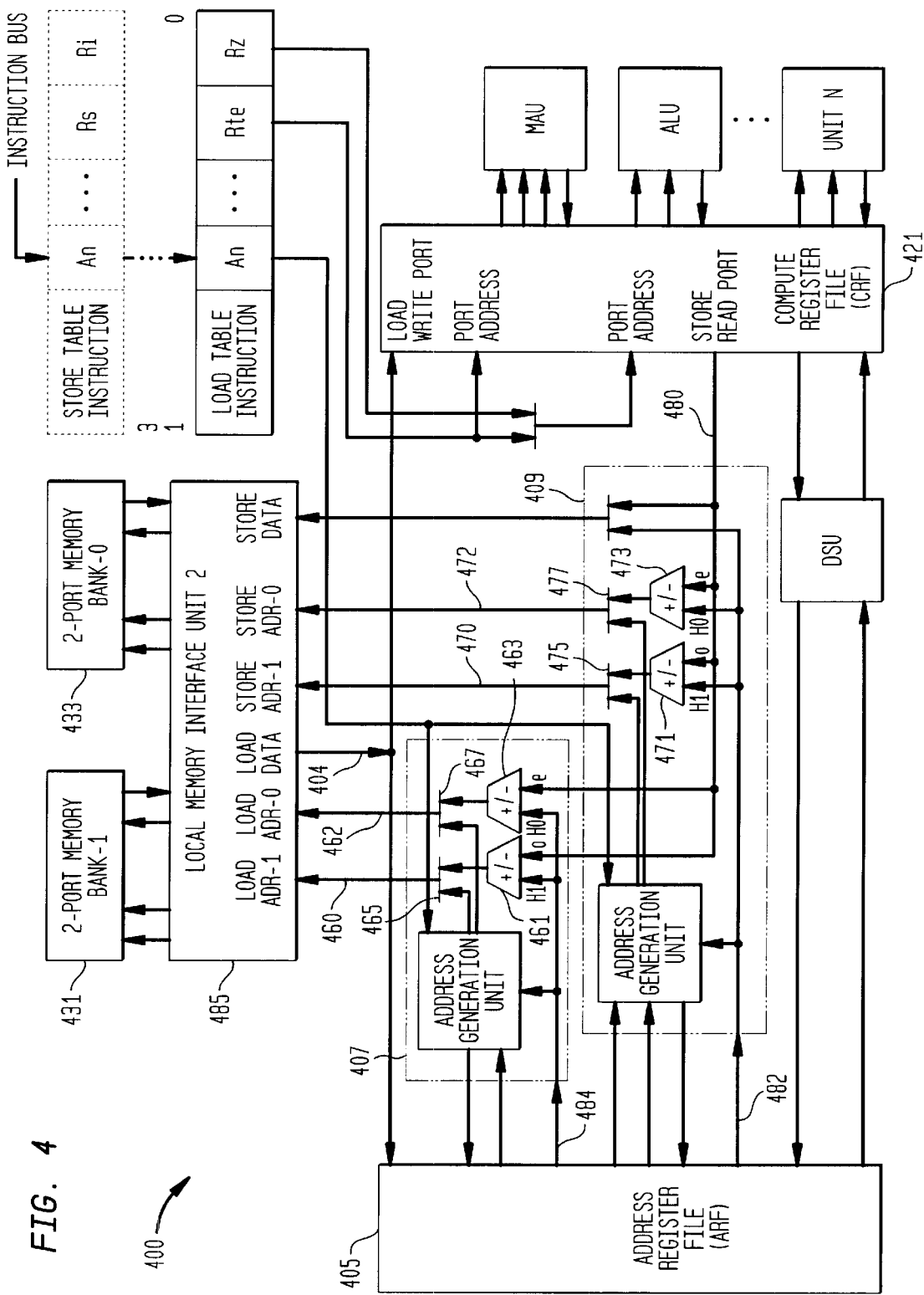
FIG. 4 illustrates a dual load table and dual store to table apparatus in accordance with the present invention.

FIG. 4 shows, in additional detail, a logical view of the extended load and store apparatus 400 necessary to perform two data-dependent table look-up and store to table operations. Exemplary detailed instruction format and operation descriptions are contained in FIGS. 6A and 6B for a presently preferred dual table look-up instruction (L2TBL), and in FIGS. 8A and 8B for a presently preferred dual store to table instruction (S2TBL). The dual operations are defined using the same principles discussed above for the single table look-up and single store to table operations.

In order to support two simultaneous data-dependent table look-up operations, a local memory interface unit 2 485, shown in FIG. 4, uses both memory bank-1 431 and memory bank-0 433 simultaneously to support two load operations in parallel or two store operations in parallel. When compared with apparatus 300, the extended load and store apparatus 400 includes a modified load unit 407 including two address adders 461 and 463 and two multiplexers 465 and 467. These components are utilized for the generation of two load addresses, Load Adr-1 460 and Load Adr-0 462. The extended load and store apparatus 400 also includes a modified store unit 409 including two address adders 471 and 473 and two multiplexers 475 and 477. These components generate two store addresses, Store Adr-1 470 and Store Adr-0 472. Supporting these extensions are the use of the reconfigurable CRF made up of two 16×32-bit files. One of the 16×32-bit files is accessed with the odd (o) register addresses and the other 16×32-bit file is accessed with the even (e) register addresses. The 32-bit odd and even outputs of the CRF 421 require only the HO 16-bit half-word portion of each odd and even read ports for use in the load unit adders 461 and 463, and in store unit adders 471 and 473. Similarly, the 32-bit read ports 484 and 482 of ARF 405 are each treated as two 16-bit sections noted as H1 for 16-bit half-word bits 31-16 and HO for 16-bit half-word bits 15-0. It is realized that other address generation equations are possible given the data available on the read ports.

Load and Store Table Instructions

Three types of load and store table instructions are provided in the ManArray architecture for single table operations, LTBL and STBL, for dual table operations, L2TBL and S2TBL, and four table operations, L4TBL and S4TBL Instructions. A presently preferred load from table (LTBL) instruction encoding 500 is shown in FIG. 5A and a corresponding syntax/operation description 510 is shown in FIG. 5B. LTBL loads a byte, half-word, word, or double-word into an SP target register from a table of elements in SP data memory or into a PE target register from a table of elements in PE local data memory. Source address register An contains the base address of the table. Compute register Rz or address register Az contains the unsigned offset of the element to load. The offset can be specified to be added to or subtracted from the base address using the decrement/increment bit (D/I) 501. Byte and half-word operands can be optionally sign-extended to 32-bits using the sign extend bit (Sx) 503. A presently preferred load from two tables (L2TBL) instruction encoding 600 is shown in FIG. 6A and a corresponding syntax/operation description 610 is shown in FIG. 6B. In more detail, the load from table instructions support three instruction types of operation:

1. Single Address Table Look-Up (LTBL) FIGS. 5A and 5B: In this single address generation instruction type, An and Rz registers contain table address base and an address offset respectively. In this mode of operation, a single computed effective address is generated, addressing both local memories as determined by the specified data type. Double word (D), single word (1W), single half-word-0 (H0), and single byte (B0) data types are supported by the architecture. Due to the general nature of the addressing mechanism, this instruction can be used to load a data value from any data dependent memory address in local memory, not just from a table of data values. It is noted that in FIGS. 5A and 5B, AtMRt is any register except a compute register, and $R_zA_z$ is any address or compute register. In this implementation example, Doubleword access must align on doubleword boundaries.

2. Dual Address Table Look-Up (L2TBL) FIGS. 6A and 6B: In this dual address generation instruction type, the 32-bit An register contains two 16-bit base-register addresses, half-word sections An.H1 and An.H0. The Rz half-words, Rze.H0 and Rzo.H0, are either added to or subtracted from the base register as specified by the D/I bit 601 to form two independent memory addresses. The local memory is treated as two separate banks, each addressable independently. By loading the An register with a value where An.H1=An.H0, a common table base address pointer can be used. The address generated must be in the memory map range for each memory bank as defined by an implementation. If a generated address is outside of the addressable memory bank range, then the results are indeterminate. An.H0+Rze.H0 addresses bank-0 and An.H1+Rzo.H0 addresses bank-1. This allows for two, identical or different LUTs, residing in two different local memory banks, to be accessed simultaneously producing independent output results. Maximum architecture defined size of the LUT is 64 K entries. The double-word (D) data type is not supported. Dual word (2W) data type is supported for table output, with bank-0.W data loading into an even Rte.W register and bank-1.W data loading into an odd Rto.W register. Dual half-word (2H0) data type is supported with bank-0.H0 data loading into an even Rte.H0 register and bank-1.H0 data loading into an odd Rto.H0 register. The H1 portion of these registers remains unchanged by the load operation unless the sign extension 603 is specified in the instruction. Dual Byte (2B0) data type is supported with bank-0.B0 data loading into an even Rte.B0 register and bank-1.B0 data loading into an odd Rto.B0 register. The B3, B2, and B1 portions of these registers remain unchanged by the load operation unless the sign extension 603 is specified in the instruction. Both compute and address registers are valid targets for LUT data. Due to the general nature of the addressing mechanism, this instruction can be used to simultaneously load two different values from any data-dependent memory address in each local memory bank, not just from two tables of data values.

3. Quad Address Table Look-Up (L4TBL) To support this instruction type, the SP and each PE data memories are split into four separate banks which are addressable independently. The addressing mechanism is organized in a similar manner to the dual table apparatus with extensions to support four banks of memory bank-0 to bank-3. This mechanism allows four LUTs, identical or different, to be accessed simultaneously with different addresses producing independent outputs. In one expected use, the bank-0 and bank-2 tables use a common base pointer address, and bank-1 and bank-3 use a common base pointer address. Maximum size of the LUT for this case is 256 entries. Double-word (D) and word data types are not supported, but quad half-word (4H) and quad byte (4B) data types are supported. Both compute CRF and address ARF registers are valid targets for LUT data.

Two bits, bit-10 and bit-9 505 (FIG. 5A), 605 (FIG. 6A), 705 (FIG. 7A), and 805 (FIG. 8A) are utilized to determine the type of operation as shown in the following table. It is noted that the exemplary encoding was chosen for a specific implementation and other encoding schemes can be used without loss of generality.

| Bit-10 | Bit-9 | Number of table look-ups |
| --- | --- | --- |
| 0 | 0 | Reserved |
| 0 | 1 | 4 table look-ups with quad address generation |
| 1 | 0 | 1 table look-up with single address generation |
| 1 | 1 | 2 table look-ups with dual address generation |

STBL Instruction

A presently preferred instruction format 700, and syntax and operation description 710, for an exemplary store to table (STBL) instruction are shown in FIGS. 7A and 7B. STBL stores a byte, halfword or word from a source register into a table of elements in memory. Source address register An contains the base address of the table. Compute register Rz or address register Az contains the unsigned offset of the element to store. The offset can be specified to be added to or subtracted from the base address using the decrement/increment bit (D/I) 701 shown in FIG. 7A. It is noted that AtMRt is any register except a compute register and that $R_zA_z$ is any address or compute register. In this implementation example, doubleword access must align on doubleword boundaries.

S2TBL Instruction

A presently preferred instruction format 800, and syntax and operation description 810 for an exemplary store to two tables (S2TBL) instruction are shown in FIGS. 8A and 8B, respectively. S2TBL stores two bytes, two halfwords, or two words from an even and odd source register into two tables of elements in SP or PE memory. Source address register An contains two 16-bit base-register addresses, half-word sections An.H1 and An.H0, for two tables. Compute registers Rze and Rzo contain the unsigned offsets of the elements to store. The offsets can be both specified to be added to or subtracted from the base address using the decrement/increment bit (D/I) 801.

LATBL Instruction

A further benefit of including the table access operation into a standard address operation, is that the "load effective address" instruction for this type of address operation (which performs the effective address calculation and returns the address rather than the memory contents) allows basic address arithmetic of the form:

| | |
| --- | --- |
| At ← As ± Rx | Address register gets the sum of an address register and a compute register. |

A presently preferred instruction format 900, and syntax and operation description 910 for an exemplary load address of table item (LATBL) instruction are shown in FIGS. 9A and 9B. In FIGS. 9A and 9B, $R_zA_z$ is any address or compute register. At is any address register, A0–A7. MT designates control-flow address registers for S/D=0 (single update). This register contains addresses used in flow control instructions, and interrupts where the 3-bit address specification bits 18–16) are: SP, 000–100=Reserved, 101=ULR user link register, 110=DBGILR debug interrupt link register, 111=GPILR general-purpose interrupt link register; and PE, 000–111 are reserved. The basic operation of the LATBL instruction is to load a 32-bit, 16-bit, or dual 16-bit effective address into an SP or PE address register At or control-flow address register Mt. The effective address is computed as the sum or difference of a base address value in address register An and an unsigned offset value in compute register Rz or address register Az as specified by the two bits 905, bit-10 and bit-9, of encoding format 900 of FIG. 9A. No memory access is performed. The bit-10 and bit-9 encoding, determine the type of operation as shown in the following table. While presently preferred encodings are described, other encodings of these bits 905 are not precluded. The data-type scaling size is defined in the size field bits 23–22.

| Bit-10 | Bit-9 | Load Address of Table Options |
|--------|-------|-------------------------------|
| 0 | 0 | Reserved |
| 0 | 1 | Reserved |
| 1 | 0 | Scaled single address loaded |
| 1 | 1 | Scaled dual addresses loaded |

Programming Conventions or Restrictions

As noted earlier, for those applications that do not need back-to-back parallel load and store operations, the load and store ports, 222 and 224, are available for other uses, such as for data-dependent load and store operations. If these other uses are not of a high utilization nature, then, with proper programming conventions or restrictions, an application's performance can be improved through the shared use of the ports. Certain programming conventions and restrictions are observed to preclude any read port access conflict from occurring. Taking into account the shared use of the store unit's CRF read port during the decode pipeline stage, the following conventions and restrictions apply, in an exemplary implementation.

The instructions add address (ADDA), subtract address (SUBA), load address of table item (LATBL), load from table (LTBL), store to table (STBL), load indirect with scaled update (LI), load indirect with unscaled update (LIU), load broadcast indirect with scaled update (LBRI), load broadcast indirect with unscaled update (LBRIU), load address indirect with scaled update (LAI), ), load address indirect with unscaled update (LAIU), store indirect with scaled update (SI), and store indirect with unscaled update (SIU) differ from all other LU and SU instructions in that they cause the address register file (ARF) and the compute register file (CRF) to be accessed simultaneously. The CRF access for these instructions always occurs via the store unit (SU). For this reason, in the exemplary implementation, the following programming considerations apply:

1. A one-cycle delay is required between an instruction that updates a CRF register and the use of the new register value as a source operand in one of the above load or store instructions. In other words, an instruction that changes the value of a compute register that is to be used in the next instruction cannot precede an ADDA, SUBA, LATBL, LTBL, STBL, LI, LIU, LBRI, LBRIU, LAI, LAIU, SI, or SIU instruction.

2. Any combination of ADDA, SUBA, LATBL, LTBL, STBL, LI, LIU, LBRI, LBRIU, LAI, LAIU, SI, and SIU must not be executed from the same VLIW when using the compute-register update value forms of the instructions.

Variable Length Decode on the ManArray

The ability to efficiently process compressed video data is an important capability digital signal processors should provide. For example, the motion picture expert group (MPEG) standards MPEG-1 International Standard ISO/IEC 11172-2 First edition Aug. 1, 1993 Part 2 Video and MPEG-2 ISO/IEC 13818-2 First edition May 5, 1996 Video specify a video compression process which encodes a video image into a compressed serial bitstream for efficient storage and transmission. A high level view of the video decoding process illustrated in FIG. 10 for an MPEG type decoder 1000 is used to reconstruct the video images 1070 (decoded data) from a compressed video bitstream 1010. The first step in decoding the bitstream is header processing by a header processor 1020. By definition of the standard, an MPEG bitstream is constructed as a hierarchy of six layers: video sequence, group of pictures (GOPs), picture, slice, macroblock, and block. The header processor 1020 decodes the header information for the parameters governing the decode process for this video bitstream. For example, one of the outputs 1022 of header processing is the quantizer scale code used in inverse quantization block 1062 and another output 1024 provides the macroblock and block layer data. The macroblock header defines many of the parameters of the 16×16 luminence pels for further processing. One of the outputs 1032 of the variable length code (VLC) decode block 1030 is the set of motion vectors required by a motion compensation unit 1064.

The present invention may be advantageously applied to the efficient processing of block layer data utilizing a programmable decoder in accordance with the present invention as described further below. The block data decoding process consists of three highly sequential functions: a variable length code (VLC) decode function 1030, run length processing 1040, and zigzag scan order processing 1050. The other MPEG functions of block 1060 are not discussed in this invention but an introductory description can be found in D. L. Gall, "MPEG: A video compression standard for multimedia applications", in Communications of the ACM, 34(4), pp. 46–58, April 1991 which is incorporated by reference in its entirety herein.

In an encoded block data bitstream 1024, there is no indication of where the boundaries exist between the different variable length encoded-symbols or codewords. The codewords have the property that short codewords correspond to symbols of high probability of occurrence while the longer codewords correspond to low probability of occurrence symbols. Compression of image data in a video sequence, as specified by the MPEG standards, is in part obtained by assigning the higher occurrence symbols with short codewords based upon prior detailed analysis. Consequently, the encoded bitstream must be analyzed in a sequential decision tree type process to determine the variable length codes.

Rather than utilize special purpose hardware logic, which adds to the complexity of a design and cannot be used for any other purpose, general instruction capability is available in the ManArray processor as described herein to efficiently process the sequential codes. A number of architectural features are used including bit-operation instructions, table look-up, table store, VLIWs, and conditional execution. In addition, it is noted that each video decoder can, and in many cases, will have different VLC tables which, if incorporated in fixed hardware, only increase the complexity of the special single-purpose hardware. With a programmable solution, different VLC tables, such as the different tables used in MPEG-1 and MPEG-2 VLC decoders, for example, can be easily handled.

In an MPEG encoder, each 8×8 block of 64 quantized frequency coefficients, termed the AC coefficients, is processed in a zigzag ordering so that the most probable AC coefficients are processed first. In addition, the 8×8 block of quantized AC coefficients on average contains a large number of zero elements allowing the data to be compressed by encoding a run-length of zeros, thereby not requiring the zeros to be individually encoded. In the decoder, this process is reversed as shown in blocks 1030, 1040, and 1050 of FIG. 10, to reconstruct the 8×8 block in a quantized form. The inverse quantization 1062 and then the inverse discrete cosine transform (IDCT) 1066 follow as part of the image reconstruction process.

Bitstream Decoding

The incoming bitstream is received into a memory subsystem of a processing system from either a file or an external data source. For example, the SP data memory 121 of FIG. 1 can be used for this purpose. The bitstream is then processed sequentially according to the protocol defined in the MPEG-1 and MPEG-2 standards. MPEG-1 and 2 use discrete cosine transform (DCT) based forms of compression. As defined in the standards, there is header information specifying characteristics of the various levels of the video bitstream. With focus on the block processing, it is noted that within each macroblock there are a number of 8×8 blocks (the exact number is encoded within the macroblock header information) that are comprised of a single DC coefficient value followed by an arbitrary number of AC coefficients. Each 8×8 block is terminated by a special end-of-block code, thus eliminating the need to include trailing zeros. The DC and AC coefficients, the output of an 8×8 DCT encoder function, and the end-of-block code are encoded in the bitstream in a variable length form. In addition, each block is encoded in a zigzag scan order to improve the performance of the run-length encoding scheme used by MPEG.

The decoding of the AC coefficients is highly sequential. Since the codes used to represent the coefficients are of varying length, it is not possible to definitely determine a code until its predecessor has been decoded. Each code represents two values. These values are 1) run, the number of zeroes to be inserted into the zigzag scan order, and 2) level, the magnitude of the AC coefficient. The MPEG standards include Tables B.14 and B.15 for encoding of the AC coefficients.

Each of the variable length codes can be up to sixteen bits in length. In addition, it is noted that there is a provision for an escape sequence for values that are not in the table. The MPEG Software Simulation Group's C-code software includes this information in a series of tables representing Tables B.14 and B.15, where each table entry contains three values. These values are: 1) run, the number of zeros to be inserted into the zigzag scan order, 2) level, the magnitude of the AC coefficient, and 3) length, the length (in bits) of the variable length code. Tables B.14 and B.15 can be divided into sub-table sections quite readily.

In the process sequence, the DC coefficient comes first followed by the AC coefficients. Assuming the DC coefficient has been already processed, we proceed with describing the processing of the AC coefficients. By interpreting the next 16 bits of the incoming bitstream as a binary number, the table can be bracketed into multiple sections. For example, the MPEG Software Simulation Group's C-code MPEG-2 Encoder/Decoder Version 1.2 Jul. 19, 1996 software (c) 1996 brackets the values into eight ranges. They are ($codes \geq 16384$), ($16384 > codes \geq 1024$), ($1024 > codes \geq 512$), ($512 > codes \geq 256$), ($256 > codes \geq 128$), ($128 > codes \geq 64$), ($64 > codes \geq 32$), and ($32 > codes \geq 16$).

A code excerpt 1100, a decode AC coefficients routine, from the MPEG Software Simulation Group's C-code for the decoding of the AC coefficients is shown in FIG. 11 for illustrative purposes. In FIG. 11, the function Show_Bits(n) used in this routine 1100 copies the next n bits, starting at the current pointer position, from the incoming bitstream to a compute register. Once there, the bits can then be manipulated in various ways, including evaluation as a binary number. The Show_Bits(n) function does not advance the current pointer. The advancement cannot be done until the length of the current VLC codeword is determined.

The decode AC coefficients routine 1100 then determines the bracket for the binary value ("if" statements), selects the proper sub-table and arithmetically adjusts the pointer (tab= specified value). Subsequent code performs a table look-up of the run, level, and length values. The current pointer is then incremented by the length of the VLC codeword. Then, if not an end-of-block or escape code, the sign bit is retrieved from the bitstream and the current pointer incremented by one.

When translated into assembler code in a typical general purpose processor or DSP, this decode AC coefficient routine becomes branch intensive, representing a time consuming expense for the application. Due to this time consuming sequential processing, typical prior art systems have used hardware assisted approaches to implement the VLC decode function. The approach outlined in the present invention, uses the instruction set capabilities of the ManArray processor as described herein to provide efficient processing of the MPEG-1 and 2 variable length codes.

Special Bit-Operations

Figure 12E:
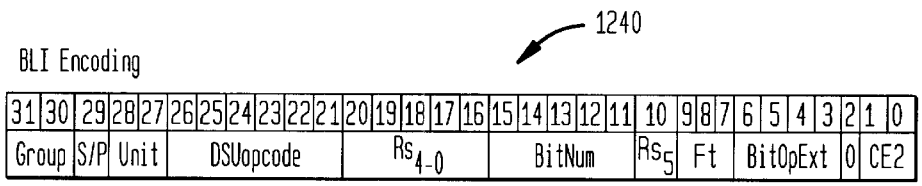
FIG. 12E illustrates a bit load immediate (BLI) instruction encoding in accordance with the present invention.

A simple implementation of the sub-tables, as shown in the C-code of FIG. 11, would be quite time consuming in practice. For example, codes in the range between 64 and 128 would be tested against six different values (the six if statements of the FIG. 11 C-code requiring five branches to get to the sixth if test). By noting that each of the range values is a power of two, and using a ManArray scan right (SCANR) instruction 1200 shown in FIG. 12A having the syntax and operation 1210 shown in FIG. 12B, the appropriate range can be found directly. The SCANR instruction 1200 scans a value in a source compute register from the most-significant bit to the least-significant bit for a "1" bit. The position of the first "1" bit, a number between 0 and 31, is returned in byte-0 of the target register. The Z arithmetic condition flag is set if a zero is found. This value can then be used as an offset into an SP memory table containing the address of the appropriate code segment for the particular code range encountered. Due the construction of the MPEG-1 table B.14 and sub-tree tables beyond codewords of length 6-bits in MPEG2 table B.15, this technique is quite efficient. A sample pseudo-code segment follows below and illustrates aspects of the efficiency of the method of the present invention:

1) Show_Bits R0,16
2) SCANR R1,R0
3) nop
4) LoadTable At,Ab,R1
5) nop
6) jmpi At.

The above pseudo-code is interpreted as follows.

Line 1 contains the macro Show_Bits( ) code that copies the next sixteen bits of the incoming bitstream into compute register R0 lower half-word and clears the upper half-word.

Line 2 uses the SCANR instruction to find the position of the most significant bit of the binary value in R0 and loads this count value into R1. It is noted that the zero case in the sample application code has been handled earlier so the code at this point is guaranteed to have a valid non-zero result from SCANR. Alternatively, if this was not the case, the conditional-Z form of the instruction (SCANRZ), FIG. 12B, can be used to distinguish a zero result between "no '1' bits found" (F0=1) and "a '1' bit found in bit position zero" (F0=0).

Line 3 contains a delay cycle to allow for the pipeline of the exemplary implementation. Instructions other than a no-operation "nop" can be used to accomplish this task and useful work.

Line 4 contains a table-lookup. This loads address register At with the value found in the SP data memory lookup-table at the address Ab+R1, where the table origin address is in address register Ab and the offset into the table is in compute register R1. The table entries correspond to starting addresses for code segments to be executed.

Line 5 contains a delay cycle to allow for the pipeline of the example implementation. Instructions other than a no-operation "nop" can be used to accomplish this task and useful work.

Line 6 contains a jump indirect to the starting address for the specific code(s) to be processed corresponding to this sub-table.

Table Look-Up

The load table (LTBL) instruction can load a word into either an address register or a compute register. Both capabilities are used in the ManArray variable length decoder as presently described. The first is used for program flow control. The second is used for variable retrieval.

The flow control method uses the SCANR instruction described previously. In more detail, the SCANR instruction returns a value in a compute register, namely the value is the location of the first "1" bit scanning from left to right beginning at bit-31 in the source register. This value is then used as an offset into a pre-built address table stored in SP memory. This table contains addresses of the appropriate code segments for the particular code range encountered. The assembler statically computes the actual values of the address-table and places the table origin at a specified address in the SP data memory. The LTBL instruction loads the address associated with the variable length code into an address register At. This is followed by a jump indirect (JMPI) instruction that directs the program flow to the appropriate section of code at the address At loaded by the LTBL instruction. Using this method avoids the costly if then, else-if, else-if, and so on, constructs typical of the prior art. As noted earlier, the present method improves the efficiency of the MPEG-1 AC coefficient decoding. A sample address table 1300 is shown in FIG. 13A.

During the decoding of the incoming bitstream, the MPEG protocol specifies that the next bit, the one just past the variable length code, represents the sign bit. If its value is zero, then the AC coefficient is positive. If the bit is set to 1, then the AC coefficient is negative. One method of determining the bit value loads the next bit into a compute register, and compares its value to zero (or one). The AC coefficient magnitude is then modified accordingly. However, this approach usually entails using Show_Bits(1) to find the next bit, doing the comparison, then acting accordingly. Alternatively, by acquiring 17 bits from the incoming bitstream, the sign bit is always available in a compute register. The address table 1300 of FIG. 13A is modified slightly to accommodate this extra bit.

The variable retrieval method of table look-up is utilized with the MPEG-2 decoder. A variable length code table associated with the AC coefficients (Table B.15) in MPEG-2 has different characteristics than its MPEG-1 counterpart. The flow control method used for MPEG-1 yields only a small improvement when applied to the MPEG-2 decoder relative to a ManArray compare/jump implementation of the C-code. A hybrid method is used to implement decoding with the MPEG-2 table.

Figure 14:
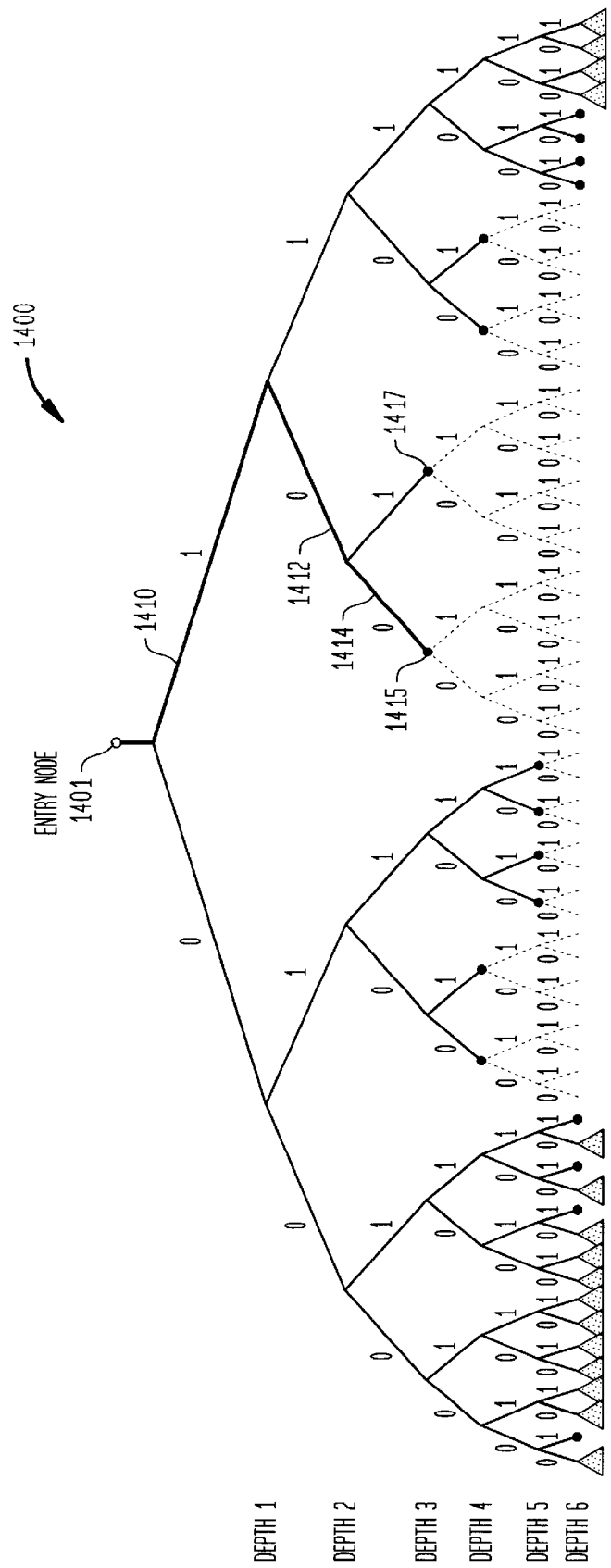
FIG. 14 illustrates an MPEG table B.15 as a decision tree for the purposes of describing how table look-up can be used in the present invention.

Viewing Table B.15 as a decision tree 1400 as illustrated in FIG. 14 leads to a different solution. The tree 1400 is comprised of six depths. Each depth corresponds to one bit in the variable length code based upon the tree arcs traversed. For example, beginning at entry node 1401 and proceeding to the "Depth 1" nodes, the first bit will determine which half of the decision tree path to follow depending on whether the first bit was a zero or a one. At "Depth 2", two bits will be determined. This continues until a terminal node or sub-tree is reached. The solid arcs indicate significant bits along the decision path. A solid node indicates a terminal node. A terminal node is defined as a point in the decision tree where all information about the variable length code is known including its sign bit. Dashed arcs indicate "don't care" bits. That is, the values of these bits have no bearing on the decoding. For example, given the bit code "100000", the last three bits do not affect the decoding. The actual code being processed is "100", path 1410, 1412, 1414 to terminal node 1415, thus the last three bits are "don't cares", indicated by the dashed arcs emanating below the terminal node 1415. The method for handling this in determining the variable length code is to label all of the nodes that start with "100" identically. Therefore leaf nodes "100000","100001","100010", "100011", "100100", "100101", "100110", and "100111" can all be labeled "100XXX". Similarly leaf nodes underneath "101" terminal node 1417 can be labeled "101XXX". The terminal node represents the bit pattern determined by traversing the decision tree to arrive at the node. The trailing X's indicate the "don't care" bits. A shaded triangle indicates a sub-tree. That is, it will take more than six bits to decode this variable length code.

Several observations concerning this decision tree are made here. Most of the variable length codes are of short length (the variable length codes also known as Huffman codes have this trait by definition), say 3–5 bits. A table for 5-bit variable length codes covers half of the variable length code paths possible in the decision tree. Including a $6^{th}$ bit for the sign bit would not greatly add to the size of the table since $2^6$ or 64 entries equals 64 words of SP memory. A 64-entry table is more efficient than a 32-entry table since more terminal nodes are reached and less additional processing would be required to determine the final variable length code. The shorter codes (e.g., 3 bits plus a sign bit) have multiple code entries in the table. The longer codes (most of them are greater than 11-bits) all start with six zeros. The use of SCANR is advantageously appropriate here.

One advantageous method for decoding codes in Table B.15 is as follows. First, use Show_Bits( ) to copy the next 17 bits in the incoming bitstream to a compute register. The reason for acquiring 17 bits at first is to eliminate the necessity of a second Show_Bits( ) call if a subtree is encountered where the variable length code is of length 16. Second, use a shift right immediate (SHRI) instruction to copy the six most significant bits of the 17 bits into another compute register. These six bits are the index into the decision tree at the "Depth 6" leaf node level. Use these six bits with the LTBL instruction to load the address of the code segment corresponding to the appropriate node in the decision tree. For the more frequent variable length codes (these are terminal nodes in the tree 1400 of FIG. 14), the run, level, and sign are simply assembly-coded directly into the ManArray program segment associated with the terminal node. For the less frequent variable length codes (located in the sub-trees of FIG. 14), specific program segments handle these appropriately.

Another instance of table look-up for the retrieval of variable length code information is used as previously described for the MPEG-1 table for parts of the MPEG-2 table using the SCANR instruction. In the MPEG Software Simulation Group C-code, each variable length code (except ESCAPE and End-of-Block) has three associated values.

They are the run (number of zeros preceding this AC coefficient), the level (magnitude of this AC coefficient), and length (the length in bits of this code word). As used in the C-code segment shown in FIG. 11, the 16-bit binary value is shifted right and then a constant is subtracted from the value so that it can be used as a table index. Tab is used as a pointer to the appropriate table 3-tuple entry. These three table values are loaded separately into three compute registers via the use of three LTBL instructions. The run, level, and length values are encoded in 8-bits and are loaded right justified into the ManArray compute registers. A sample run-level-length table 1310 is shown in FIG. 13B. The LTBL instruction is used in the ManArray MPEG-2 decoder for retrieving data from specially built run-level tables when the length is always known for a particular code range, but the run and level are determined by table look-up.

Also, the table look-up for de-referencing the zigzag scan can be executed as soon as the current position of the AC coefficient in the zigzag order is known. This position is known immediately if run=0 or after the run is added to the current position indicator. At this point, the AC coefficient's position in the zigzag order is known and a table look-up is used to obtain the new position for the AC coefficient. This position can be the de-reference of the zigzag order by itself or in combination with data ordering in preparation for further processing in the decoder by block 1060 of FIG. 10.

iVLIWs

Very long instruction words in the ManArray architecture allow the parallel execution of up to 5 pre-built instructions. While the variable length decode process is highly sequential, there are program local variable independencies that can be exploited for parallel VLIW execution. For example, the Flush_Bits( ) operation advances the bit pointer in the incoming bitstream by the appropriate length of the current variable length code, then it is called again to advance the bit pointer one additional time for the sign bit if neither an ESCAPE code nor an End-of-Block code was encountered. In many of the program segments this pointer advancement can be accomplished anywhere, hence in parallel with the other decoding operations. Since in our presently preferred embodiment the bitstream pointer in the ManArray implementation is maintained in a compute register, the MAU can be used to add the appropriate value (hence advancing the bit pointer) while other execution units are otherwise occupied. The table look-up for de-referencing the zigzag scan order may simultaneously occur while a check for an out-of-range index occurs.

The ManArray store-to-table instruction, using the position generated from the previous LTBL for de-referencing the zigzag scan order, is used for conditionally storing the decoded AC coefficient in SP memory (in the 8×8 block of AC coefficients) and can be executed while a fault flag is conditionally being set where both conditional execution operations are based on the result of the above out-of-range check. The LTBL and STBL instructions are used to change the order of the incoming data from the zigzag ordering into a different ordering that is more efficient for further processing. The LTBL uses the calculated zigzag scan order value as an offset into a table. This table contains the new position values where the AC coefficients are to be stored, thereby de-referencing them from their previous zigzag order. The following STBL instruction uses the value obtained from the LTBL operation as an offset in the effective address calculation that points to the desired location in a 2-dimensional table where the AC coefficient is to be stored as required for efficient processing in block 1060 of FIG. 10.

Since the compression algorithm typically results in an 8×8 block that contains many zeros, the processing steps address the non-zero coefficient data. Consequently, the 8×8 block is "zeroed" out prior to any decoding starts. This is done in a separate subroutine that zeroes out the entire MacroBlock before the MacroBlock decoding starts. As an example, one way to accomplish this on the ManArray processor is by a series of double-word stores of zeros from a register pair.

Conditional Execution

Figure 12F:
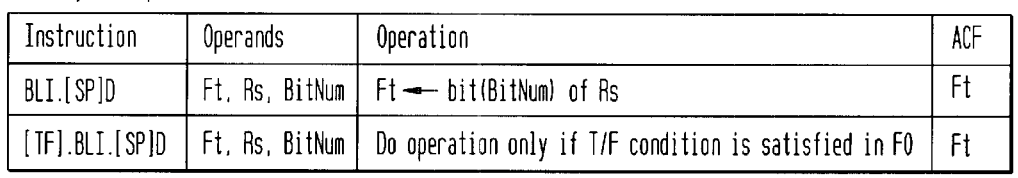
FIG. 12F illustrates the BLI syntax and operation description for the instruction of FIG. 12E.

The ManArray conditional execution architecture allows for highly efficient non-branching code as shown in the example of FIGS. 15A and B. Specifically, four instances where conditional execution is used in variable length decode are discussed below as exemplary:

1. F0=Sign Bit: The bit load instruction illustrated in FIGS. 12C and 12D allows the appropriate sign bit in the incoming code to be copied to the ACF F0 flag. This flag controls conditional execution for subsequent operations. Conditional execution is then used to negate the AC coefficient value as necessary. This eliminates the if-then flow control that requires branching around the negation code. Therefore, a single negation may be reduced to a single cycle and possibly hidden inside a VLIW. Two different forms of bit load are currently used in the ManArray code implementation of the video decoder: the bit load (BL) instruction 1220 of FIG. 12C having syntax and operation 1230 of FIG. 12D, and the bit load immediate (BLI) instruction 1240 of FIG. 12E having syntax and operation 1250 of FIG. 12F. In the BL instruction a single bit from source register Rs is stored in ACF Ft. The source register bit is specified by bits 4–0 of register Rx. In the BLI instruction a single bit from source register Rs is stored in ACF Ft. The source register bit is specified by the 5-bit immediate value BitNum. The first variation allows for the location of the desired bit to be computed and stored in a compute register. The second variation requires advance knowledge of the bit location to explicitly specify the value of BitNum.

2. Table Store: As a result of an out-of-range check, it may not be desirable to store the decoded value at the computed address in memory. (See the VLIW code example of FIGS. 15A and B.) By using T.STBL, this store operation is only completed if the index is in the appropriate range. And, this operation is included in a VLIW for parallel execution.

Figure 12G:
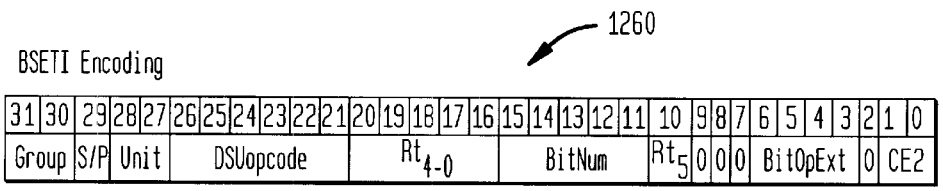
FIG. 12G illustrates a bit set immediate (BSETI) instruction encoding in accordance with the present invention.
Figure 12H:
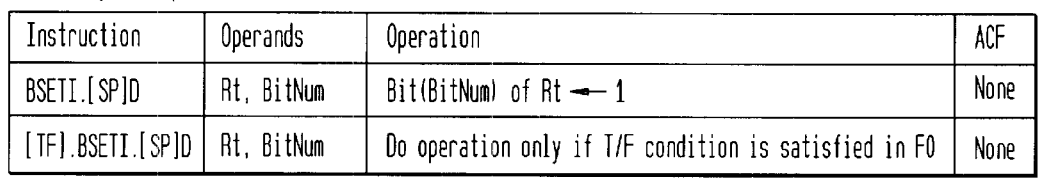
FIG. 12H illustrates the BSETI syntax and operation description for the instruction of FIG. 12G.

3. Bit set: As a result of an out-of-range check, it may be necessary to set the Fault_Flag. By using the bit set immediate (F.BSETI) instruction 1260 of FIG. 12G having the syntax and operation 1270 of FIG. 12H, the Fault_Flag stored in this implementation as a single bit of a status word in a compute register can conditionally be set in a single cycle. In the BSETI instruction a "1" is stored in a single bit of target register Rt. The target register bit is specified by a 5-bit immediate value BitNum. This operation may be included in a VLIW, thereby increasing the level of parallelism. Specifically, a conditional store instruction is executed in parallel with a conditional bit set instruction (BSETI) in the same VLIW, VLIW_28 at line 1526 of FIG. 15B, with contents of iVLIW_28 shown in lines 1511 and 1512 of FIG. 15A. Based on the ACF F0 flag, a store operation occurs if the F0 flag is true or the fault flag is set by BSETI if the F0 flag is false. Consequently, two independent operations, conditionally executed based on a single flag, can be coded in a single VLIW.

4. Conditional Branch: As a result of an out-of-range check, it may be necessary to abort the decoding of an 8×8 block of coefficients. This can be done in two ways, one being more efficient. First, a conditional branch to the error-handling code can be evaluated, and possibly executed. That is, if an error exists, then branch to the error routine. If the branch is not taken, then a branch to the top of the for-loop is taken, and decoding of the next AC coefficient is commenced. This is correct control flow, however it is not efficient. The conditional branch takes three cycles in the exemplary implementation, whether or not the branch is taken, followed by two cycles for the unconditional branch. This is a total of five cycles per AC coefficient. A better way to implement this is to perform a conditional branch to the top of the for-loop. If the branch is not taken, then an unconditional branch to the error routine is taken. Since the error routine is almost never invoked, especially in error-free data streams, the total number of executed cycles is only three for valid decoded coefficients. A saving of two cycles per AC coefficient is realized.

Decoding Example

Using ManArray VLIWs and conditional execution can often reduce the program segment associated with a particular variable length code to a very short execution time (including zigzag scan de-reference, out-of-range check, bit pointer advancement, coefficient value assignment, value storage, and Fault_Flag update). A sample VLIW pseudo-code 1500 for variable length code 111011 is shown in FIGS. 15A and B. This code decodes "111011" into run=0, level=5, len=6, and sign=True. Note that the variable "js" is the index into a de-scramble and de-zigzag scan table and RBITPTR is a pointer value, register R26 used in example code, that points into the current bitstream buffer double-word stored in RBFR (and RBFR_odd). RBFR also refers to the even-odd pair R20/R21, in the code example, which holds 64-bits of the bitstream buffer. R__64, R22 in the code example, holds the constant "64" and "MPEG_STATUS" is a register, R18 in the code example, that contains numerous flags including a "FAULT_FLAG". "A0" contains the current address of the bitstream buffer in SP memory.

Four VLIWs are used in this code and the VIM address they are stored in is indicated with an underscore# notation. For example, VIM address 41 is indicated by VLIW_41. These VIM locations are used in the MPEG functional code that this code segment, FIGS. 15A and B, was taken from but can be placed in different locations in VIM without affecting the functionality of the example code segment. The code segment 1500 begins with the load iVLIW set up instructions shown in FIG. 15A, which operates as follows:

LV VLIW_40 1501: Load iVLIW #40 consisting of an ALU and a DSU instruction.
  VLIW_40 ALU conditional add immediate instruction 1502: conditionally adjusts the bit-pointer in the incoming bitstream buffer. The pointer is incremented by 32 only when a new 32-bit word is cycled into the double-word bit-buffer. This is part of flushbits( ). Since the bit-pointer (RBITPTR) is used quite frequently, its value is stored in a compute register for quicker access.
  VLIW_40 DSU conditional copy instruction 1503: conditionally copies the least significant word in the double-word bit-buffer to the most significant word. This is done only when a new 32-bit word is cycled into the double-word bit-buffer. This is part of flushbits( ).

LV VLIW_41 1504: Load iVLIW #41 consisting of a Load and an ALU instruction.
  VLIW_41 Load unit load table instruction 1505: de-references the zigzag scan order.
  The address register A5 has been pre-loaded with the start address of the zigzag de-referencing table prior to decoding the entire 8×8 block. The computer register R3 was updated with the current index value during the Show_Bits( ) macro. The load table instruction adds the index value as an offset to the start address to form the memory address of the data to be loaded into register R4 which holds the zigzag scan index value.
  VLIW_41 ALU compare immediate less than or equal to (cmpiLE) instruction 1506: performs the out-of-range check by using a compare less than instruction (cmpiLE). The arithmetic condition flag F0 flag is set accordingly.

LV VLIW_42 1507: Load iVLIW #42 consisting of a load and an ALU instruction.
  VLIW_42 Load unit conditional load indirect with scaled immediate update instruction 1508: conditionally loads a new 32-bit word from the incoming bitstream buffer in local memory to the least significant word in the double-word bit buffer.
  VLIW_42 ALU compare less than (cmpLT) instruction 1509: performs an in-range check of the current coefficient index. If the value is less than 64, then ACF F0 flag is set indicating the value is in range. If the value is out of range, i.e. greater than or equal to 64, then the F0 flag will not be set. This flag is used by a subsequent instruction in this algorithm. The compute register R__64 contains the constant value 64.

LV VLIW_28 1510: Load iVLIW #28 consisting of a store and a DSU instruction.
  VLIW_28 Store unit conditional store table Instruction 1511: conditionally stores the coefficient value only if the in-range test passed in VLIW 42 cmpLT instruction. This instruction conditionally executes if the ACF F0 flag is true (T), i.e. F0=1.
  VLIW_28 DSU F.bseti instruction 1512: sets the FAULT_FLAG bit in a global status word only if the in-range test failed in VLIW 42 CMPLT instruction. This instruction conditionally executes if the ACF F0 flag is false (F), i.e. F0=0.

The actual program code 1520 that operates on the data is shown in FIG. 1SB and consists of eight lines of code 1521–1528:

Subtract-Immediate Instruction (subi) 1521: start of flush-bits 6 to adjust the bit-buffer pointer by 6, which is the length of codeword being decoded.
Execute VLIW_41 (xv.s V0,41,E=LA,F=) 1522: causes VLIW_41 to execute the two instructions in parallel.
Execute VLIW_40 (xv.s V0,40,E=AD,F=) 1523: causes VLIW_40 to execute the two instructions in parallel.
Execute VLIW_42 (xv.s V0,42,E=LA,F=A) 1524: causes YLIW_42 to execute the two instructions in parallel, and the results of the ALU set ACF F0.
Load immediate instruction (lim) 1525: loads the level value or 33 magnitude into a compute register. Since the code-segment table was built including the sign bit in this case, the appropriate signed magnitude can be used.
Execute VLIW_28 (xv.s V0,28,E=SD,F=N) 1526: causes VLIW_28 to execute the two instructions in parallel.
Conditional jump instruction (T.jmp) 1527: conditionally jumps to continue processing the next code.

Jump (jmp) 1528: it is an error if the program gets to this point so jump to appropriate code to handle the error.

The result is the execution of 10 instructions in 7 cycles. Each VLIW takes one cycle (there are 4), each simple instruction, such as lines 1521 and 1525, takes one cycle, and there is a one-cycle delay for the expansion of the pipeline for the first VLIW.

Figure 10:
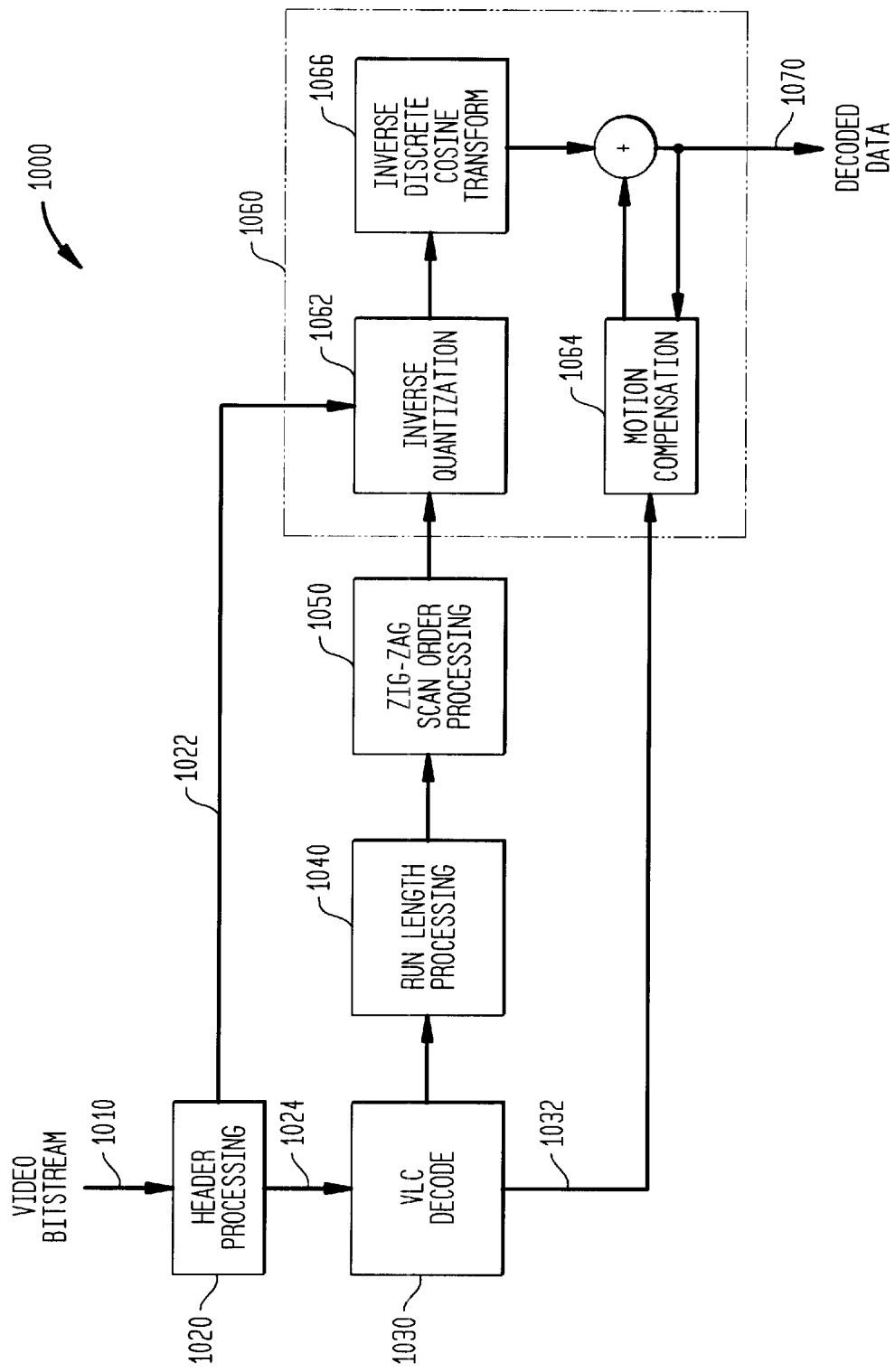
FIG. 10 illustrates a high level view of an MPEG type decoder.
Figure 16:
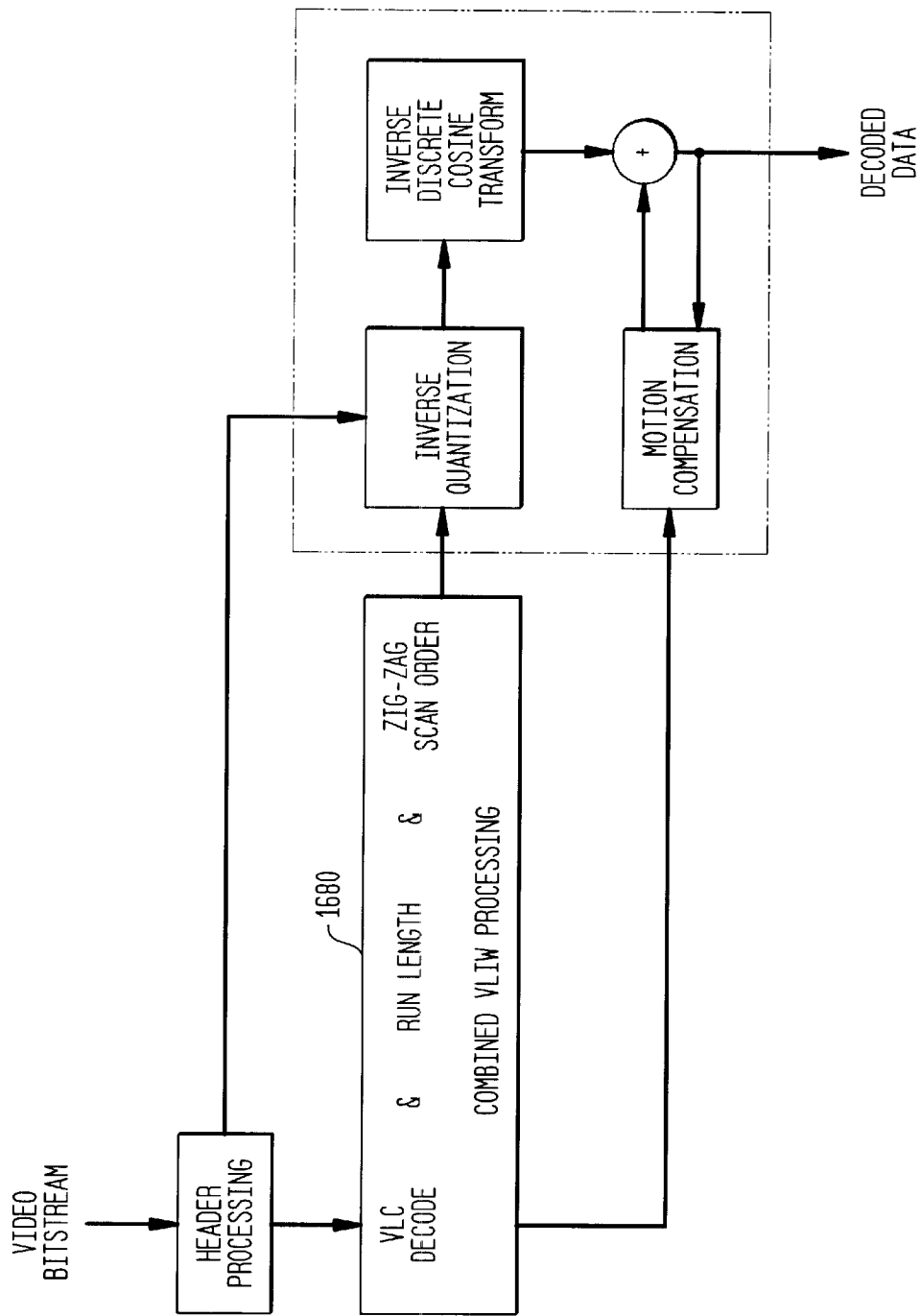
FIG. 16 illustrates the resultant compressed form of the MPEG type decoder using the VLIW algorithm with load table and store to table instructions.

The result of the above described VLIW variable length decode processing is that the blocks 1030, 1040, and 1050, of FIG. 10 may be efficiently combined into a single block 1680 as shown in FIG. 16.

While the present invention has been disclosed in the context of various aspects of presently preferred embodiments, it will be recognized that the invention may be suitably applied to other environments and applications consistent with the claims which follow.

We claim:

1. A processor for performing efficient data-dependent load and store operations from and to memory during a decode and execute pipeline stage, said processor comprising:
   a compute register file (CRF);
   an address register file (ARF) having an address register storing a memory pointer value;
   a memory;
   a load unit;
   a store unit;
   a load unit write port to the CRF; and
   a store unit read port from the CRF, wherein the load unit is connected to the load write port, and the store read port is connected to both the load unit and the store unit, whereby the load unit and the store unit share the store unit CRF read port for data-dependent load address generation operations in which the memory pointer value from the address register is combined with a compute register file value, and data-dependent store address generation operations, respectively, during the decode pipeline stage and the load unit and the store unit control the data-dependent load and store operations, respectively, during the execute pipeline stage.

2. The apparatus of claim 1 wherein said processor is an indirect very long instruction word (iVLIW) processor in which the store unit may operate in parallel with the load unit.

3. The apparatus of claim 1 wherein said processor is a processing element of an array processor.

4. The apparatus of claim 1 wherein said processor is one of a plurality of similarly configured processing elements in a ManArray architecture.

5. The apparatus of claim 1 wherein said processor is an array controller sequence processor.

6. The apparatus of claim 2 wherein said data-dependent load and said data-dependent store operations may occur simultaneously in parallel using a single shared read port by the load and store units.

7. The apparatus of claim 2 wherein said iVLIW processor further comprises a table access instruction which does not require additional ports into the CRF and ARF while maintaining single cycle execution.

8. The apparatus of claim 1 further comprising a table access instruction which does not require additional ports into the CRF and ARF while maintaining single cycle execution.

9. The apparatus of claim 8 wherein the table access instruction is a load from table instruction having at least two bits to determine the number of table look-up modes of operation.

10. The apparatus of claim 8 wherein the table access instruction is a store to table instruction having at least two bits to determine a mode of operation.

11. The apparatus of claim 1 further comprising a mechanism for providing data dependent address arithmetic functions using minimal additional hardware.

12. The apparatus of claim 2 further comprising a single memory with a read port and a write port to support simultaneous data-dependent load and data-dependent store operations in parallel.

13. The apparatus of claim 2 wherein the load unit further comprises an address adder and a multiplexer to generate a data-dependent load address during the decode pipeline stage.

14. The apparatus of claim 2 wherein the store unit further comprises an address adder and a multiplexer to generate a data-dependent store address during the decode pipeline stage.

15. The apparatus of claim 1 further comprising a memory divided into first and second banks to support two load operations in parallel or two store operations in parallel using both banks.

16. The apparatus of claim 1 wherein the load unit further comprises two address adders and two multiplexers to generate two data-dependent load addresses during the decode pipeline stage.

17. The apparatus of claim 1 wherein the store unit further comprises two address adders and two multiplexers to generate two data-dependent store addresses during the decode pipeline stage.

18. The apparatus of claim 5 further comprising a mechanism for incorporating the table access instruction into a reserved indexed or an indirect addressing opcode space with no special processor state addressing mode required.

19. The apparatus of claim 7 wherein a plurality of table access instructions are employed, the data processor is connected in an array including a sequence processor (SP) and a plurality of processing elements (PEs) so that support is provided for multiple simultaneous table operations per SP and in each PE.

20. The apparatus of claim 1 further comprising a table look-up instruction supporting direct targeting of nodes in a decision tree without traversing edges of the decision tree by using the data-dependent load operation.

21. The apparatus of claim 1 further comprising a scan right for first one bit detection (SCANR) instruction to avoid costly if then, else-if constructs by determining a first one bit in a source register.

22. The apparatus of claim 9 further comprising very long instruction word (VLIW) instructions utilized to parallelize processing of a normally highly sequential process.

23. The apparatus of claim 2 further comprising specialized bit instructions and operations, such as bit load (BL), bit load immediate (BLI), and bit set immediate (BSETI) to improve the efficiency of operation by their use in a very long instruction word (VLIW) for the parallel processing of a normally highly sequential process.

24. The apparatus of claim 2 further comprising means for conditional execution in subinstructions of a very long instruction word (VLIW) to improve the efficiency of flow control operations of a normally highly sequential process.

25. The apparatus of claim 1 further comprising means for exploiting local variable independencies by the parallel operation on independent variables in very long instruction word (VLIW) processors for parallel execution of a highly sequential process.

26. The apparatus of claim 1 further comprising means for using a load table to obtain a value which is used as a register address offset in a store to table operation.

27. A system for performing a data-dependent table look-up operation comprising:
- an instruction bus for receiving a dispatched instruction;
- an instruction register connected to the instruction bus;
- first and second address generation units connected to the instruction register;
- an address register file having an address base register;
- a compute register file;
- a first memory bank individually accessible through a local memory interface unit by a first load or a first store table instruction;
- a second memory bank individually accessible through the local memory interface unit by a second load or a second store table instruction;
- a first multiplexer and a second multiplexer; and
- the local memory interface unit having a load address port selectably connected to access the first memory bank or the second memory bank through the operation of the first address generation unit and the first multiplexer which selects an output of the first address generation unit or a combination of a value from the address register file and a compute register file value, the local memory interface unit having a store address port selectably connected to access the first memory bank or the second memory bank through operation of the second address generation unit and the second multiplexer which selects an output of the second address generation unit or a combination of values from the address register file and the compute register file.

28. The system of claim 27 wherein the dispatched instruction specifies that a load table operation is to be performed.

29. The system of claim 28 wherein the dispatched instruction comprises a load table instruction containing an opcode, an ARF register field, a target register field, and a data-dependent offset register address field.

30. The system of claim 29 wherein a store read port of the computer register file is used during decode stage processing to read an index register from the compute register file as selected by the data-dependent offset register address field of the load table instruction.

31. The system of claim 30 further comprising an address wherein the index register is added to a base address read from the address register file during decode to select through the first multiplexer an effective address for either the first or the second memory bank as a memory load address.

32. The system of claim 27 wherein the dispatched instruction specifies that a store to table operation is to be performed.

33. A system for performing two data-dependent table look-up and store to table operations comprising:
- an instruction bus for receiving a dispatched instruction;
- an instruction register connected to the instruction bus;
- first and second address generation units connected to the instruction register;
- an address register file having an address base register;
- a compute register file;
- a first memory bank individually accessible through a local memory interface unit by a first load or a first store table instruction;
- a second memory bank individually accessible through the local memory interface unit by a second load or a second store table instruction;
- a first, second, third and fourth multiplexers; and
- the local memory interface unit having first and second load address ports selectably connected to access the first memory bank or the second memory bank through the operation of the first address generation unit and the first and second multiplexers, and first and second store address ports selectably connected to access the first memory bank or the second memory bank through operation of the second address generation unit and the third and fourth multiplexers, respectively.

34. The system of claim 33 wherein a first dispatched instruction specifies that a first load table operation is to be performed and a second dispatched instruction specifies that a second load table operation is to be performed, and if the second load table operation depends on results from the first load table operation, then a cycle is required between the first load table operation and the second load table operation.

* * * * *